(12) United States Patent
Ning et al.

(10) Patent No.: US 9,859,057 B2
(45) Date of Patent: Jan. 2, 2018

(54) CAPACITOR MODULE

(71) Applicant: Apple Inc., Cupertino, CA (US)

(72) Inventors: Gang Ning, Santa Clara, CA (US);
Raul A. Perez, San Francisco, CA (US); Parin Patel, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 146 days.

(21) Appl. No.: 14/830,598

(22) Filed: Aug. 19, 2015

(65) Prior Publication Data
US 2016/0055978 A1    Feb. 25, 2016

Related U.S. Application Data

(60) Provisional application No. 62/040,973, filed on Aug. 22, 2014, provisional application No. 62/040,975, filed on Aug. 22, 2014.

(51) Int. Cl.
| | |
|---|---|
| *H01G 5/38* | (2006.01) |
| *H01G 4/228* | (2006.01) |
| *H01G 4/10* | (2006.01) |
| *H01G 4/33* | (2006.01) |
| *H01G 13/00* | (2013.01) |
| *H01G 2/06* | (2006.01) |
| *H01G 2/10* | (2006.01) |
| *H01G 4/224* | (2006.01) |
| *H05K 3/34* | (2006.01) |

(Continued)

(52) U.S. Cl.
CPC .............. *H01G 4/228* (2013.01); *H01G 2/06* (2013.01); *H01G 2/10* (2013.01); *H01G 4/10* (2013.01); *H01G 4/224* (2013.01); *H01G 4/33* (2013.01); *H01G 13/006* (2013.01); *H05K 1/145* (2013.01); *H05K 3/3447* (2013.01); *H05K 1/144* (2013.01); *H05K 3/366* (2013.01); *H05K 2201/10015* (2013.01)

(58) Field of Classification Search
CPC ...................................................... H01G 9/012
USPC .................................................. 361/540, 541
See application file for complete search history.

(56) References Cited

U.S. PATENT DOCUMENTS

| | | | |
|---|---|---|---|
| 3,014,195 A | 12/1961 | May et al. | |
| 4,148,003 A | 4/1979 | Colburn et al. | |

(Continued)

FOREIGN PATENT DOCUMENTS

| | | | | |
|---|---|---|---|---|
| JP | 2002134359 A | * | 5/2002 | ............. H01G 2/065 |
| JP | 2012022262 A | * | 2/2012 | |

*Primary Examiner* — Eric Thomas
(74) *Attorney, Agent, or Firm* — Downey Brand LLP

(57) ABSTRACT

This application includes multiple embodiments related to capacitors. In some embodiments, capacitors are set forth as having terminal leads that extend in parallel and opposing axial directions. The embodiments discussed herein relate to a capacitor module including one or more anodized pellets for providing a charge storage within the capacitor module. The capacitor module can be configured as a surface mounted or non-surface mounted capacitor module. The capacitor module can include an array of anodized pellets arranged in multiple rows or columns of anodized pellets connected by conductive trace included in the capacitor module. In a non-surface mounted embodiment of the capacitor module, the capacitor module can include cathode and anode connections that are exclusively on the side surfaces of the capacitor module.

20 Claims, 24 Drawing Sheets

(51) Int. Cl.
    H05K 1/14      (2006.01)
    H05K 3/36      (2006.01)

(56)           References Cited

U.S. PATENT DOCUMENTS

| | | | |
|---|---|---|---|
| 4,870,537 | A | 9/1989 | Hansen |
| 2002/0054470 | A1* | 5/2002 | Kuriyama ............... H01G 9/08 <br> 361/302 |
| 2009/0154068 | A1* | 6/2009 | Choi ...................... H01G 9/012 <br> 361/533 |
| 2009/0290289 | A1* | 11/2009 | Han ...................... H01G 9/012 <br> 361/523 |
| 2011/0038102 | A1* | 2/2011 | Kim ...................... H01G 9/008 <br> 361/523 |
| 2012/0120554 | A1* | 5/2012 | Kim ...................... H01G 9/012 <br> 361/523 |
| 2012/0262847 | A1* | 10/2012 | Kawai ................... H01G 9/012 <br> 361/540 |
| 2015/0270070 | A1* | 9/2015 | Shin ....................... H01G 9/15 <br> 361/529 |
| 2016/0055975 | A1 | 2/2016 | Villarreal et al. |

\* cited by examiner

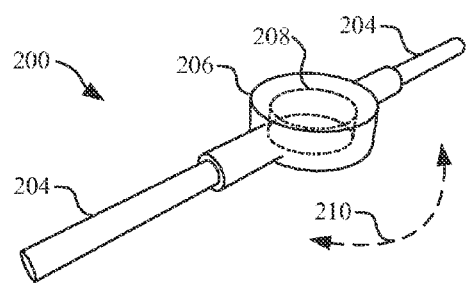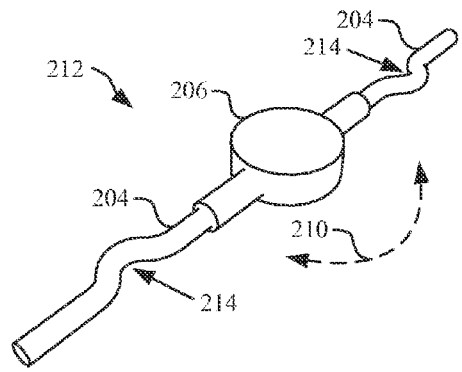
FIG. 2A    FIG. 2B
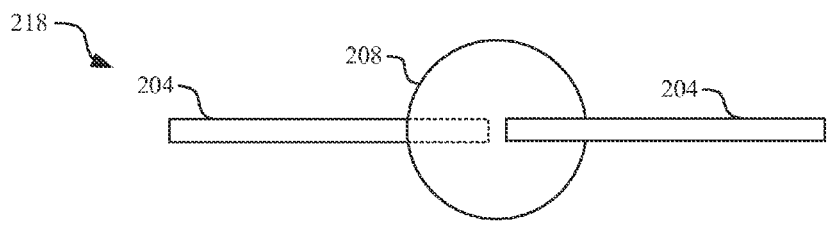
FIG. 2C
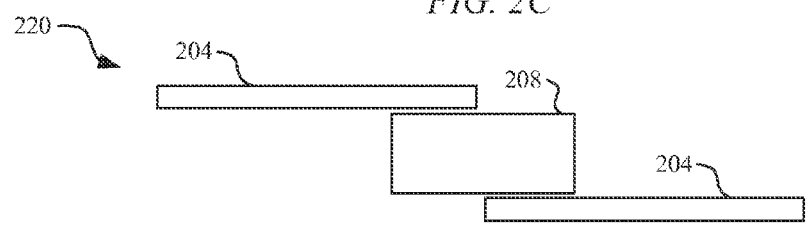
FIG. 2D
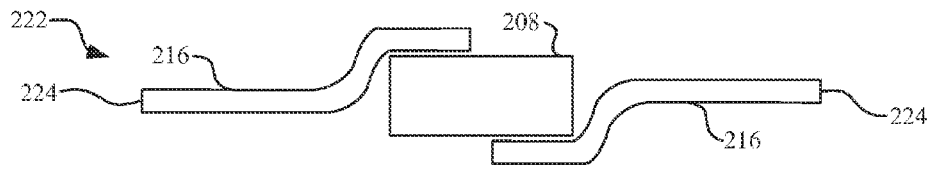
FIG. 2E

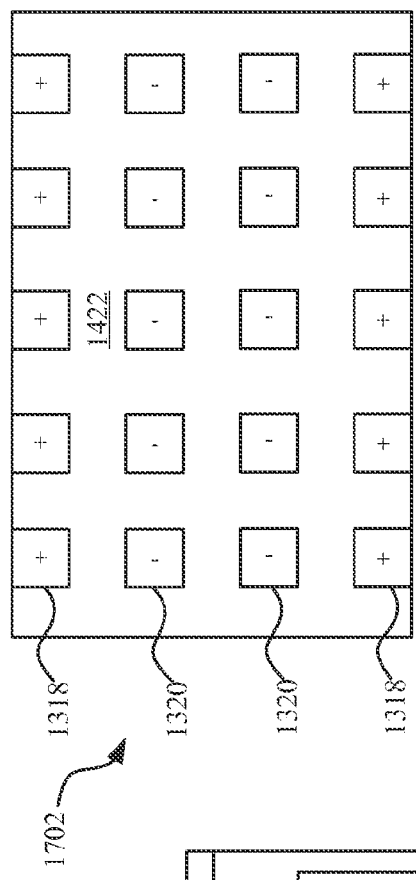
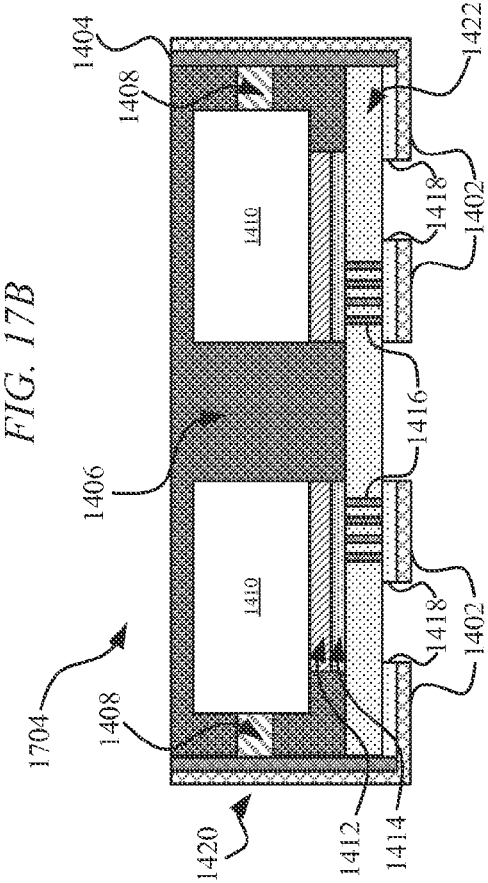
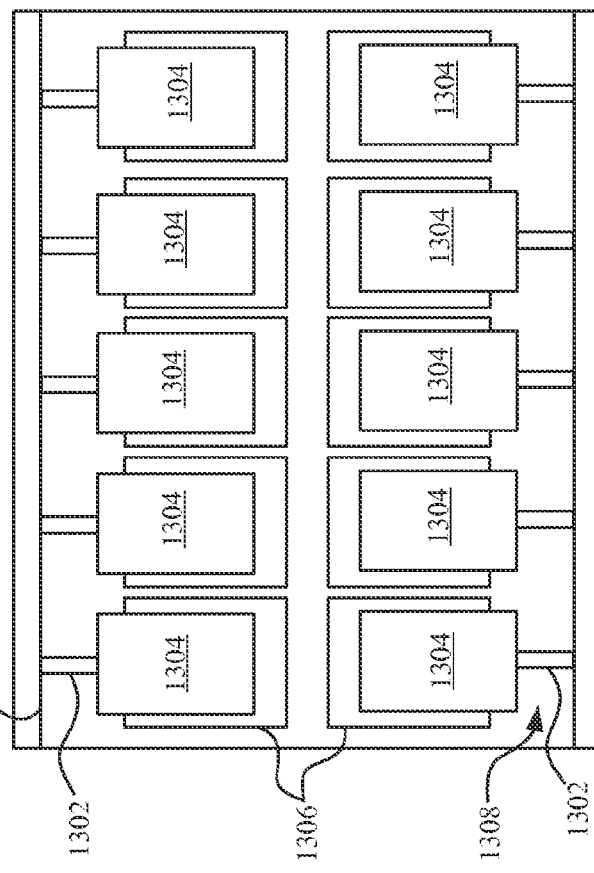

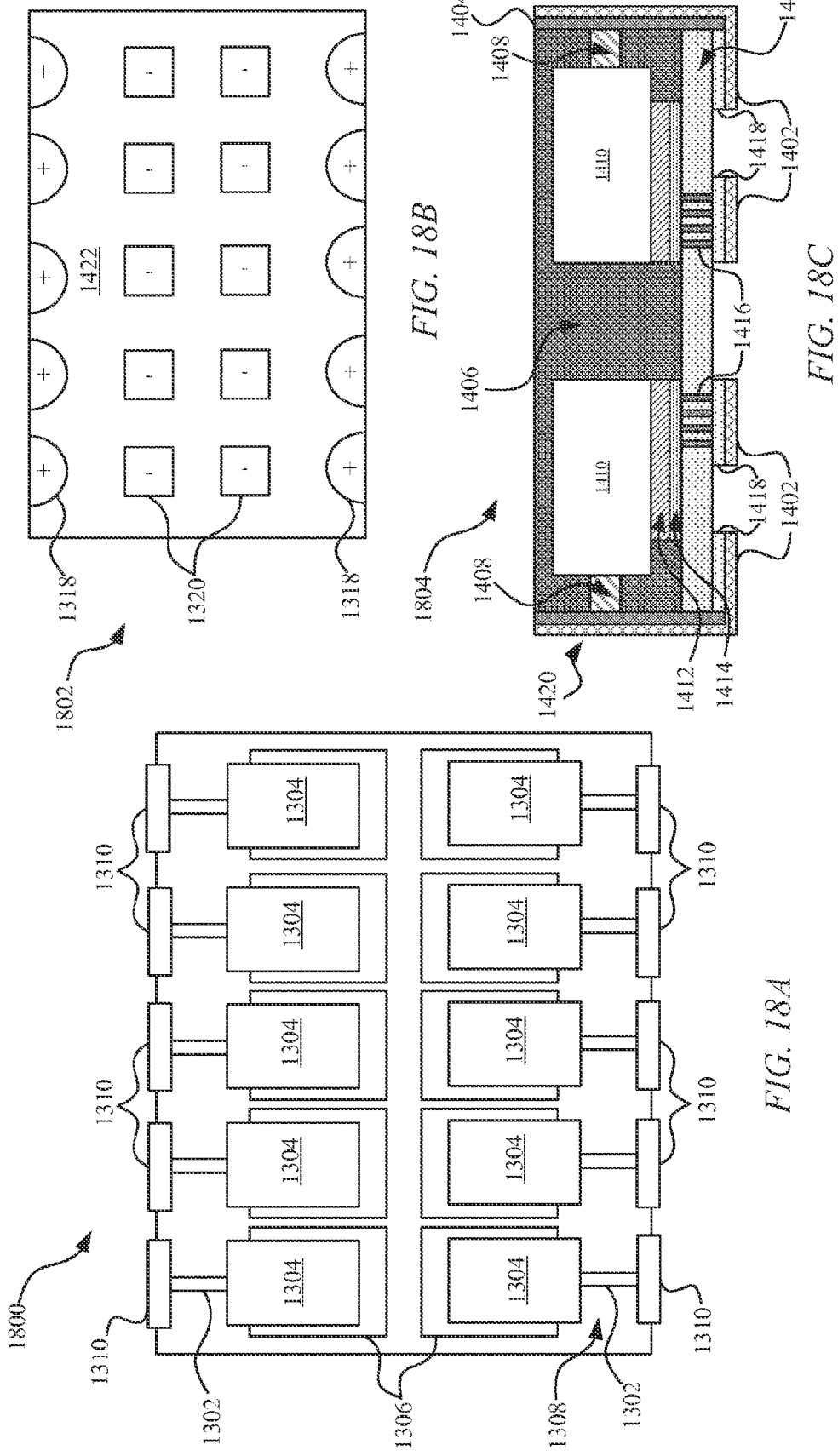

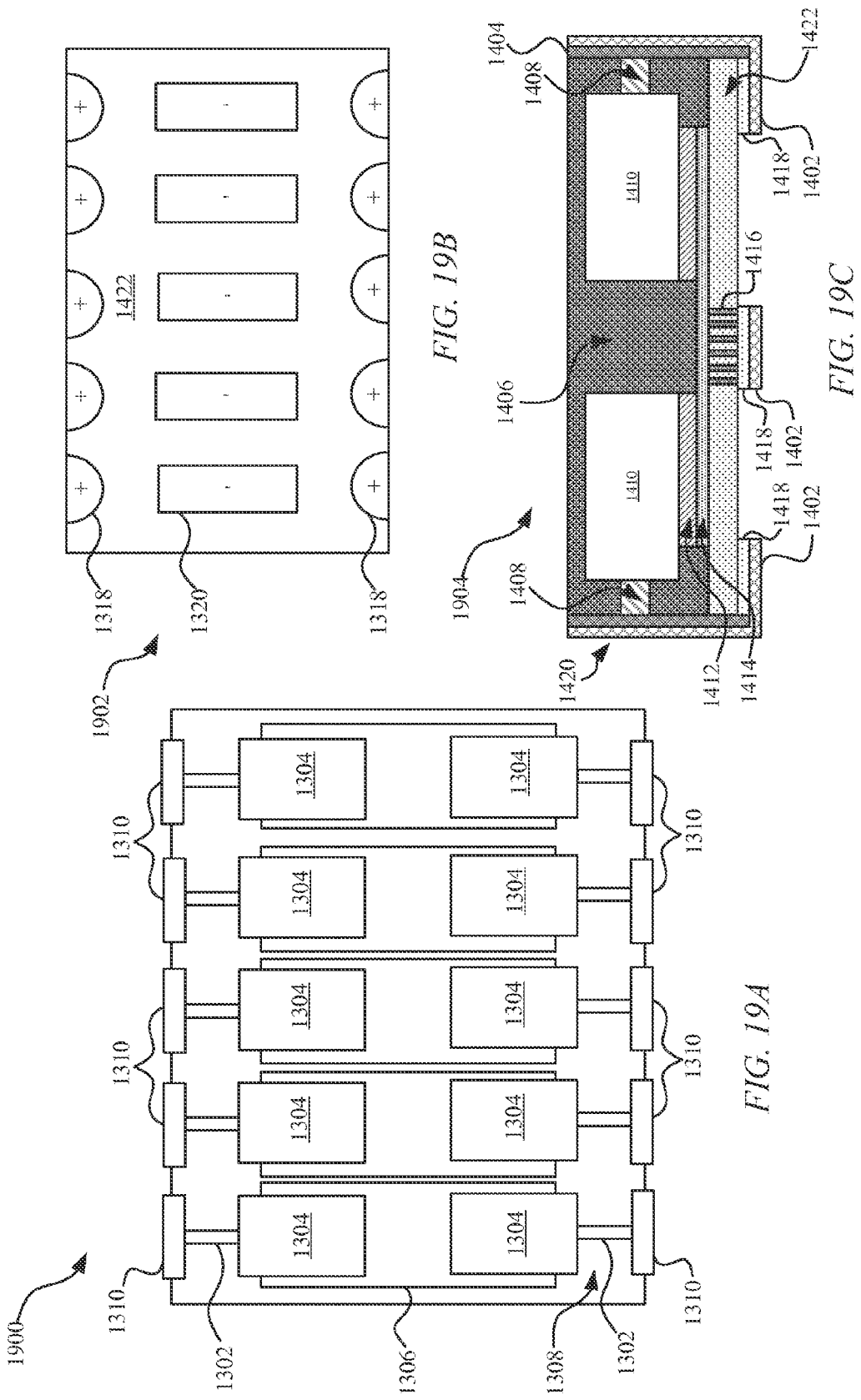

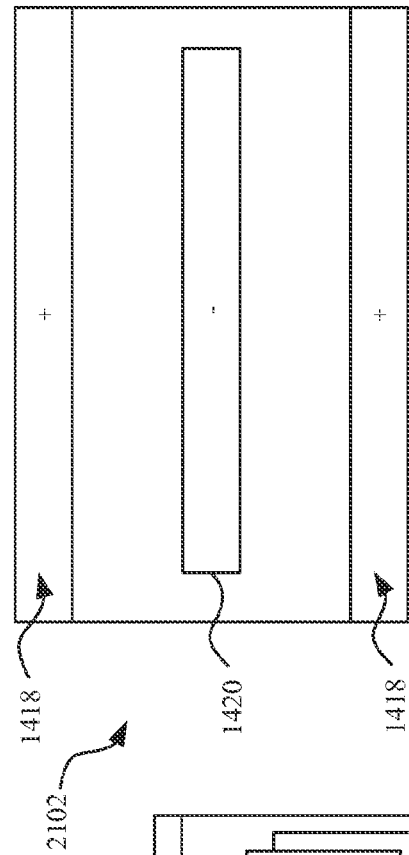
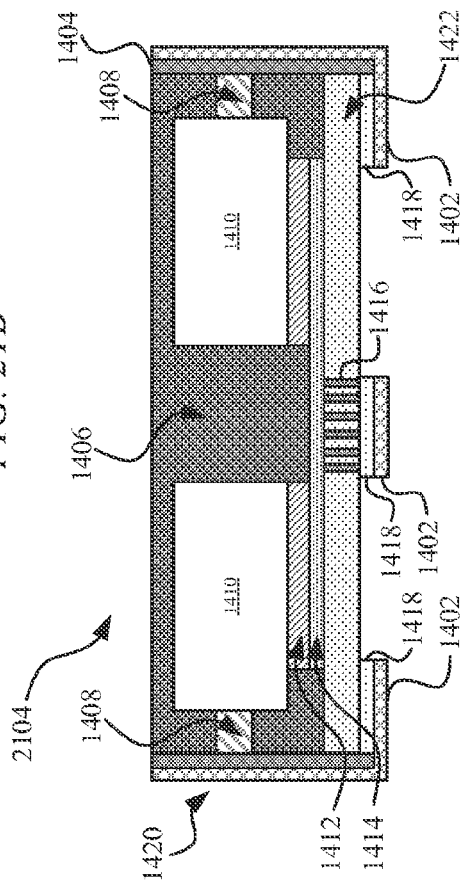
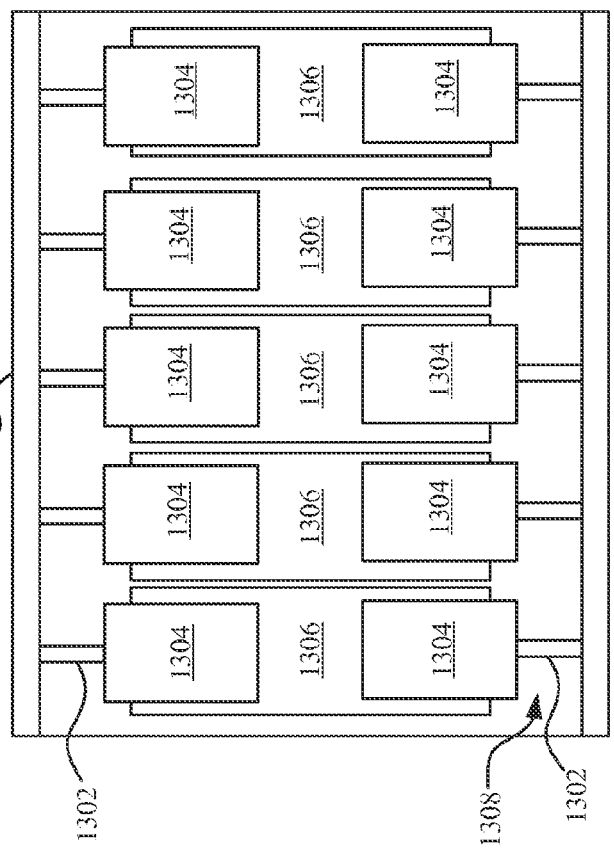

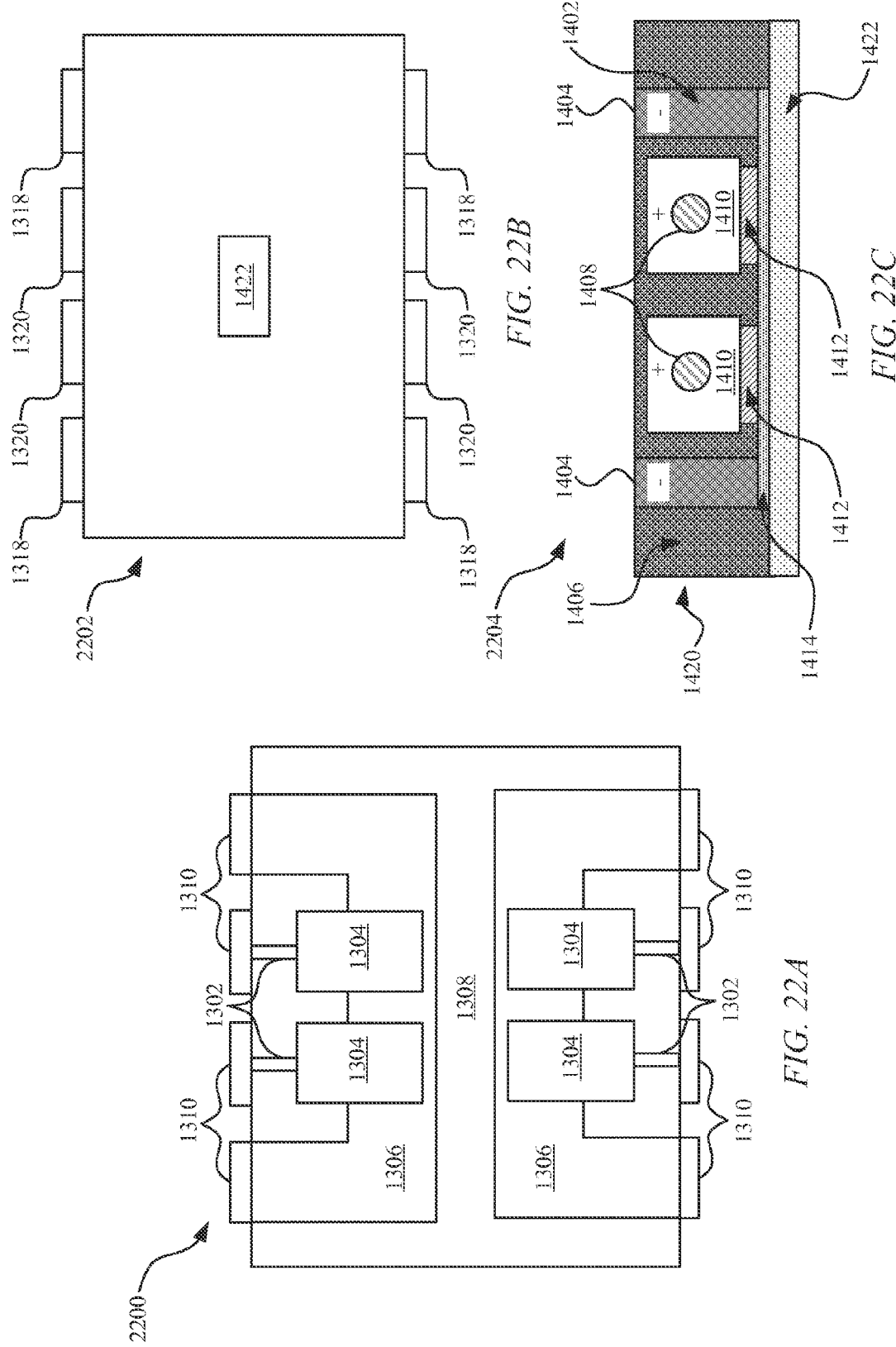

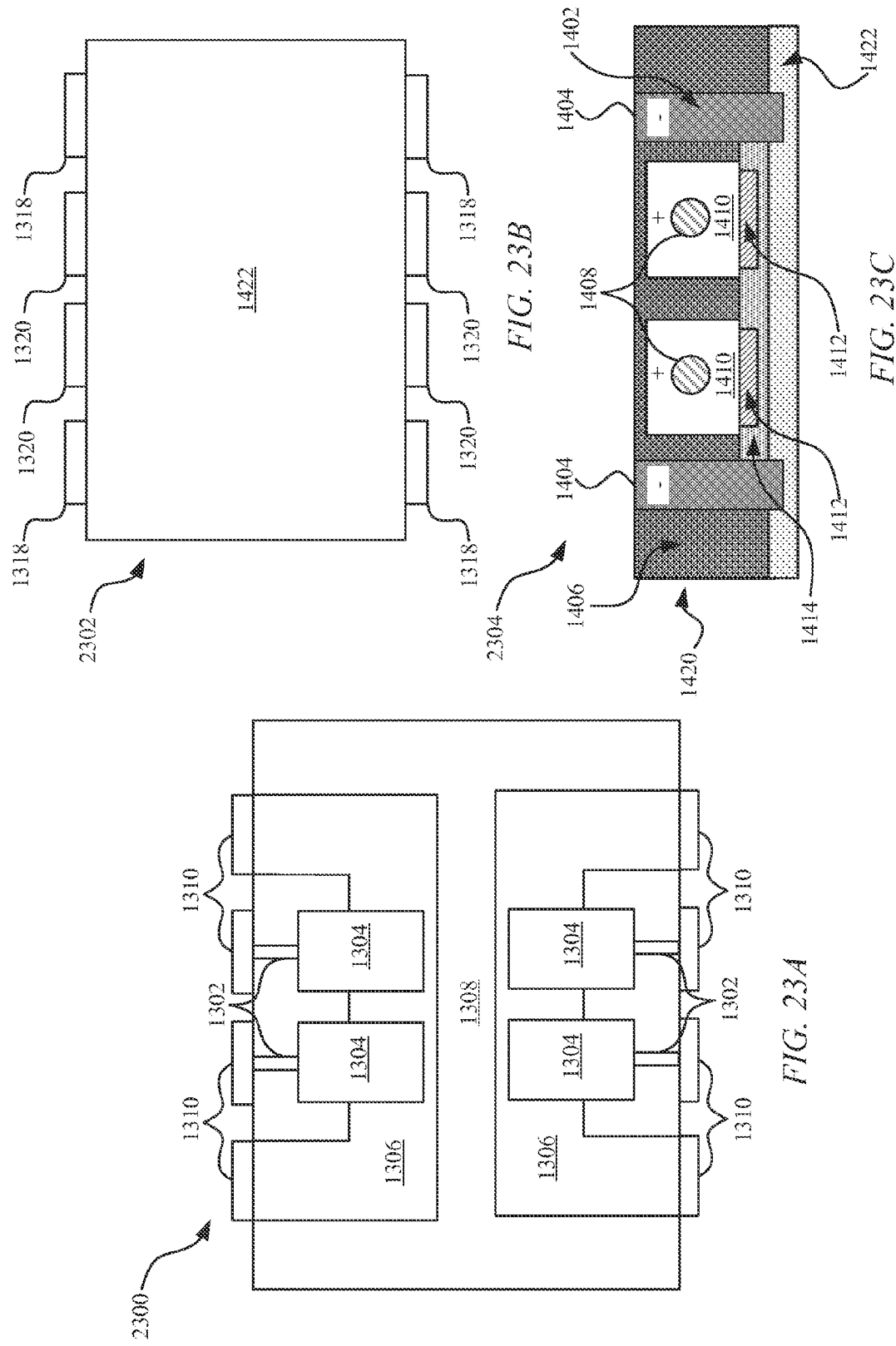

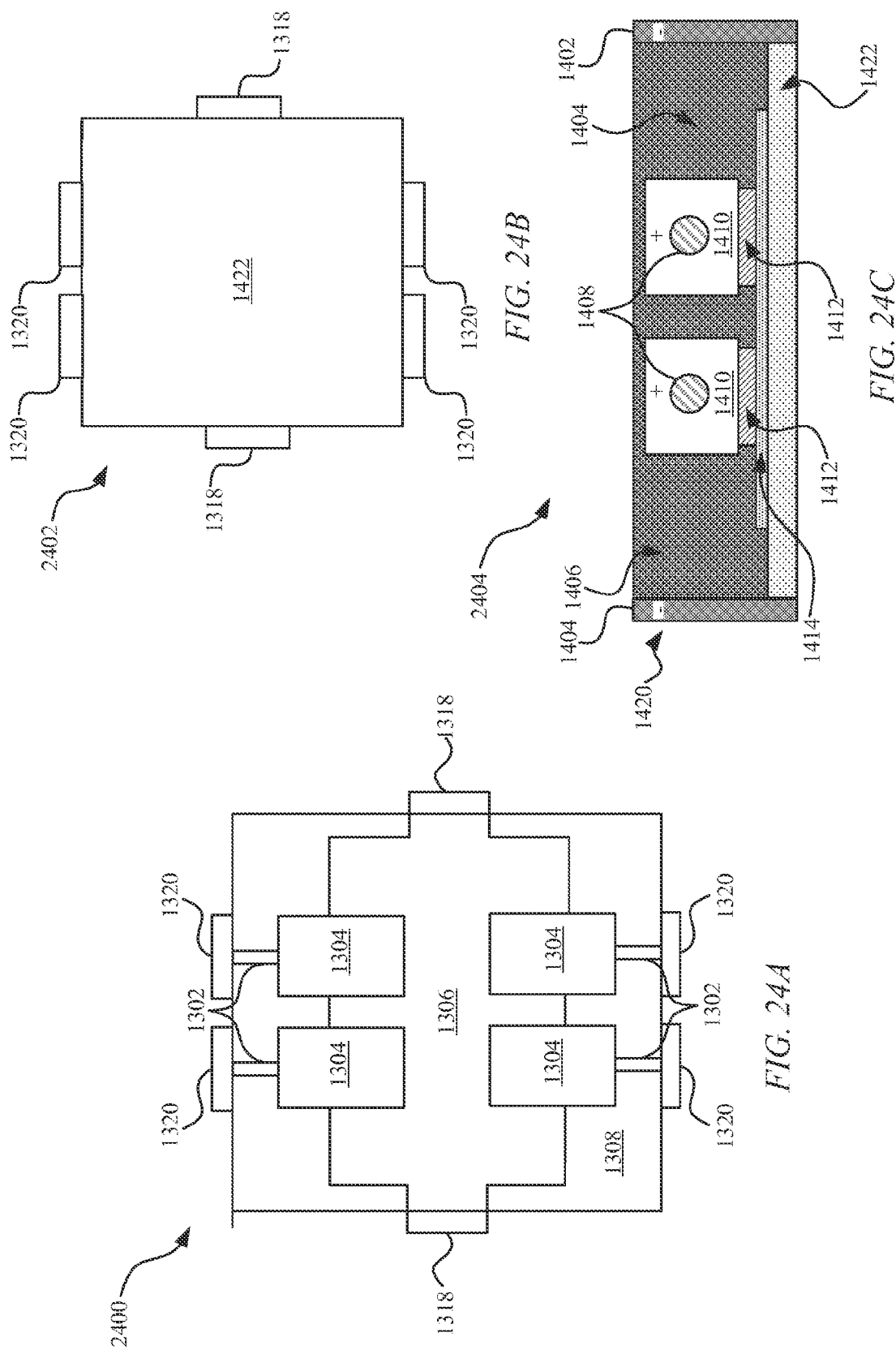

CAPACITOR MODULE

CROSS-REFERENCE TO RELATED APPLICATIONS

This application claims the benefit of U.S. Provisional Application Nos. 62/040,973, entitled "AXIAL LEAD CAPACITORS" filed Aug. 22, 2014 and 62/040,975, entitled "CAPACITOR MODULE" filed Aug. 22, 2014, the contents of which are incorporated herein by reference in their entirety for all purposes.

FIELD

The present disclosure relates generally to capacitors. More specifically, the present embodiments relate to capacitors having terminal leads that extend in parallel and opposing axial directions. Additionally, certain embodiments relate to a surface or non-surface mounted capacitor array module.

BACKGROUND

Designing compact electrical components has become imperative as electronic devices become increasingly populated with various circuits. Many electrical components, such as capacitors, are made according to a standard shape that corresponds to the manufacturing method for making the electrical components. Therefore, in order to design a new shape for a common electrical component, a new method of manufacturing the common electrical component would need to be devised. Such an undertaking may be futile because of the expenditures and labor involved with designing a new manufacturing process. Moreover, when the purpose of designing a consumer device is to lower production costs, one may be discouraged from approaching the overhaul of a relatively inexpensive manufacturing process. In order to deal with a common component that has an inadequate shape, many designers circumvent the issue of shape by designing a device to fit the common component despite the inadequate shape. However, this can often result in an inferior design compared to a design that does not require a workaround.

SUMMARY

This paper describes various embodiments that relate to capacitors having terminal leads suitable for maximizing available space in multiple printed circuit board (PCB) devices. In some embodiments, a capacitor is described having a first lead and a second lead electrically coupled to different opposing surfaces of a dielectric plate. The first lead and the second lead each extend from the dielectric plate in parallel and opposing axial directions.

In other embodiments, an electronic circuit is set forth. The electronic circuit can include at least two circuit boards electrically coupled by a capacitor. The capacitor can include a first lead and a second lead extending from a protective coating of the capacitor in opposite parallel directions.

In yet other embodiments, a system for manufacturing is set forth for manufacturing a capacitor having terminal leads oriented in opposing directions relative a dielectric plate electrically coupled between the terminal leads. The system can include a first length of tape partially configured to receive a distal end of a first terminal lead extending from a dielectric plate. The system can further include a second length of tape configured to receive a distal end of a second terminal lead extending from the dielectric plate in an opposite parallel direction relative to the first terminal lead. Additionally, the system can include a reel configured to concurrently move the first length of tape and the second length of tape toward a resin source and cause the dielectric plate to receive a coating of resin.

In some embodiments, a capacitor module is set forth. The capacitor module can include an anodized pellet coupled between (i) a conductive trace on a substrate of the capacitor module and (ii) a metallized side surface of the capacitor module. Furthermore, the anodized pellet can include valve metal particles and the substrate can have a thickness within a range of 25 micrometers to 500 micrometers.

In other embodiments, a capacitor is set forth. The capacitor can include a substrate having one or more conductive vias coupling an anodized pellet and a conductive trace extending across a surface of the substrate. The capacitor can further include a metallized surface coupled to the anodized pellet by an internal wire. The metallized surface can be substantially perpendicular to the substrate. Additionally, the substrate can include a thickness equal to or less than 500 micrometers.

In yet other embodiments, an electrical component is set forth. The electrical component can include an array of anodized pellets electrically coupled to at least one metallized side surface by at least one anode lead wire. Furthermore, the electrical component can include a conductive paste configured between an anodized pellet of the array of anodized pellets and a conductive trace arranged on a substrate of the electrical component.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The described embodiments may be better understood by reference to the following description and the accompanying drawings. Additionally, advantages of the described embodiments may be better understood by reference to the following description and accompanying drawings.

FIGS. 2A-2E illustrate embodiments of an axial lead capacitor as discussed herein.

FIGS. 17A-17C illustrates an embodiment of a surface mounted capacitor module discussed herein.

FIGS. 18A-18C illustrates an embodiment of a surface mounted capacitor module discussed herein.

FIGS. 19A-19C illustrates an embodiment of a surface mounted capacitor module discussed herein.

FIGS. 21A-21C illustrates an embodiment of a surface mounted capacitor module discussed herein.

FIGS. 22A-22C illustrates an embodiment of a non-surface mounted capacitor module discussed herein.

FIGS. 23A-23C illustrates an embodiment of a non-surface mounted capacitor module discussed herein.

FIGS. 24A-24C illustrates an embodiments of the non-surface mounted capacitor module discussed herein.

DETAILED DESCRIPTION

Figure 1:
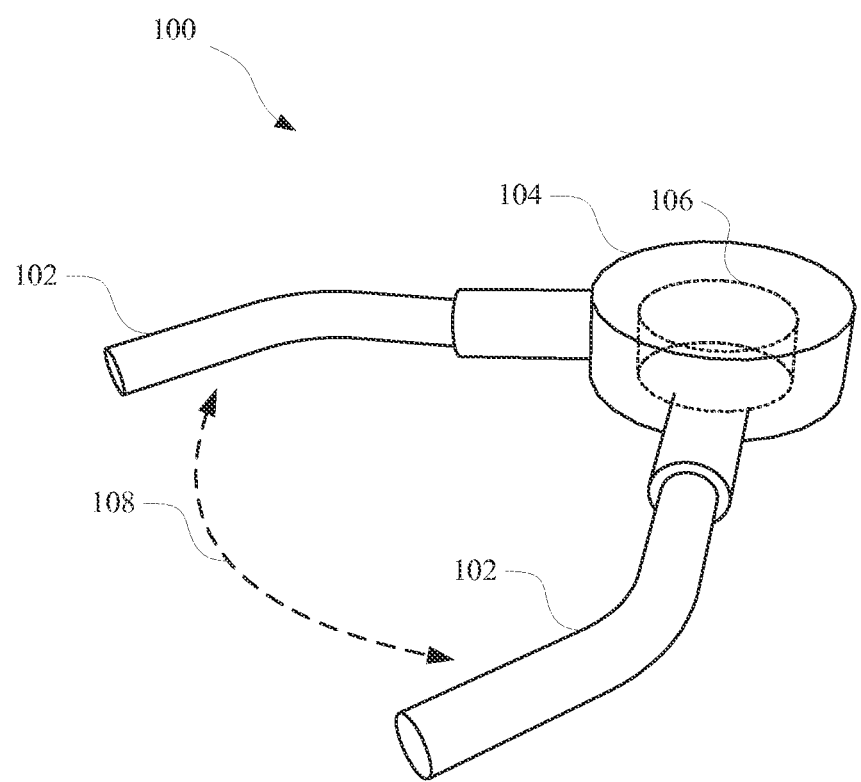
FIG. 1 illustrates a perspective view of a Y-capacitor.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

The described embodiments relate to a capacitor having terminal leads extending in an opposite directions relative to a single axis. In some embodiments, the terminal leads can extend in opposing directions from different axes. The capacitor can include a dielectric plate having a terminal lead soldered to each opposing face of the dielectric plate and coated with an epoxy. In some embodiments, each terminal lead extends from the epoxy in opposite but parallel directions in order to provide easier placement in denser, more compact circuits. Each of the terminal leads can be configured to also extend parallel to one or more surfaces of the dielectric plate. Often times, capacitors are designed for single printed circuit board (PCB) devices where all leads of the capacitor terminate on a single planar surface. As such, the capacitor will include leads that extend from the dielectric in the same direction, or in two directions having an angle of separation of approximately 90 degrees in order to more readily solder the leads into a single planar PCB. However, in electronic devices having multiple adjoined PCBs where a capacitor can bridge multiple PCBs, bending the leads of a capacitor to connect the PCBs can prove detrimental to the operation of the capacitor. For example, bending the leads of a ceramic capacitor can sometimes crack the ceramic element and cause a short between the leads. Additionally, having to bend the leads multiple times and in multiple directions can prolong the manufacturing process of a device and create more opportunities for failure. Even if a lead can be bent in a simple manner for certain devices, the lead itself can increase inductance at the capacitor. Therefore, creating a capacitor that fits within an electronic device without requiring as much length at the leads can reduce the inductance, improve manufacturability, and provide a more compact electronic device.

The capacitor discussed herein, also referred to as an axial lead capacitor, can be configured to bridge or connect at least two PCBs, or provide a connection on a single PCB. For example, the axial lead capacitor can bridge two parallel PCBs, two perpendicular PCBs, or two PCBs having any other suitable arrangement or angle of separation. In some embodiments, a primary PCB, configured for handling alternating current (AC), can be connected to a secondary PCB, configured to handle low voltage direct current (DC), using the axial lead capacitor. In this way, the axial lead capacitor can absorb current fluctuations while also providing a connection that occupies less space than other capacitors. Previously, a Y-capacitor, named for the configuration of its terminal leads resembling a "Y," was used to bridge primary and secondary circuits. However, Y-capacitors occupy an unnecessary amount space in multiple PCB devices and must be bent in awkward configurations in order to fit properly. The axial lead capacitor can also maintain critical spacing between leads in order to prevent arcing through the air between the leads. The axial lead capacitor in some embodiments can have leads separated by 120 to 180 degrees, or leads separated by 180 degrees plus or minus 5 degrees. The leads of a Y-capacitor have a smaller angle of separation than the axial lead capacitor, the Y-capacitor is more inclined to allow arcing when the leads are bent too closely together (e.g., less than 6 millimeters of separation).

The axial lead capacitor provides a more versatile capacitive component that can be created through an efficient manufacturing technique and can be placed in electronic devices in fewer steps than Y-capacitors. In order to manufacture the axial lead capacitor to include leads of having an optimal orientation, the manufacturing process should account for the desired separation of the terminal leads while also allowing adequate coating of the dielectric plate. In some embodiments, the leads are soldered to the ceramic plate or a conductive plate abutting the dielectric plate. Thereafter, a tape and reel system is used to force the leads and ceramic plate through a resin bath that coats the leads and ceramic plate with epoxy. The tape adheres to and/or covers the distal ends of the leads extending from the dielectric plate to prevent the distal ends from receiving epoxy. In some embodiments, the distal ends are interposed between two sides of the tape or two pieces of tape, and the ceramic plate and leads are thereafter moved by one or more reels through the resin bath. In other embodiments, a resin spray is used to coat the ceramic plate and the terminal leads instead of the resin bath. Additionally, the axial lead capacitor can be manufactured using a single tape and reel by attaching one terminal lead to the tape and covering the other terminal lead with a seal. Thereafter, the dielectric plate and terminal leads can be dipped into a bath or sprayed with resin in order to provide the epoxy seal around the dielectric plated and soldered terminal leads. Additionally, in each of the manufacturing processes discussed herein, a notch or bend can be placed in the terminal leads of the axial lead capacitor. In this way, the axial lead capacitor will be able to rest in a solder hole without having to manufacture other supports for the axial lead capacitor. Previously, Y-capacitors were manufactured without considering whether the leads would be bent or left straight when soldered into a PCB. For this reason, bending Y-capacitors to fit in multiple PCB devices after manufacturing can lead to the epoxy becoming proximate to a solder hole, potentially damaging the epoxy seal after soldering. However, using the axial lead capacitor, the leads can be trimmed according to the location of the solder hole in order to optimize the spacing between the epoxy and the solder holes.

The axial lead capacitor is capable of providing numerous other benefits related to the design of PCBs and electronic devices. When designing a device to have multiple ceramic capacitors, axial lead capacitors can be used to provide a more space-efficient circuit design. In some embodiments, the axial lead capacitors can be stacked such that the leads initially extend from the dielectric plate of the axial lead capacitor in either a parallel or perpendicular direction to a PCB to which the axial lead capacitors are soldered. Additionally, when the axial lead capacitor is included in a parallel PCB device, the axial lead capacitors can be arranged such that the leads initially extend from the dielectric plate in direction perpendicular to the PCBs.

The embodiments discussed herein also relate to a capacitor module. The purpose of the capacitor module is to provide a low volume high performance capacitor. The capacitor module uses one or more anodized pellets made of any suitable valve metal and surrounded by a molding compound. For example, the anodized pellets can include one or more valve metals, having particles not limited to tantalum, niobium, niobium oxide, titanium, hafnium, aluminum, and/or zirconium. In some embodiments, the anodized pellets are pre-coated with a conductive polymer. For example, the polymer can include a graphite epoxy. The substrate (e.g., an FR4 grade substrate or any other suitable substrate) of the capacitor module can be fabricated to any suitable thickness, and in some embodiments the thickness of the substrate can be from 25 micrometers to 500 micrometers. The capacitor module can be configured as a surface mounted module or a non-surface mounted module. In embodiments of the surface mounted module, a cathode connection is provided through one or more conductive vias fabricated in a substrate of the capacitor module. Furthermore, the surface mounted module can include an anode connection provided by a wire coupled between the anodized pellet and a side surface of the surface mounted module. One or more side surfaces on an external surface of the capacitor module can include a metallized layer for providing a conductive pathway from the anodized pellet to an external anode connection at the side surface. In embodiments of the non-surface mounted module or side mounted module, no conductive vias are fabricated in the substrate to create the cathode connection. Instead, metallized side surfaces are used to connect one or more internal anodes and cathodes to one or more external anodes and cathodes. In this way, the side surfaces of the capacitor module perpendicular to a PCB can be coupled to an anode and cathode connection on the PCB, rather than connecting a bottom surface of the capacitor module parallel to the PCB. Additionally, in some embodiments a conductive paste can be used on electrical traces of the substrate to increase a contact surface of the internal cathode and/or anode connections of the capacitor module. The conductive paste can include particles such as palladium, silver, and/or any other suitable conductive particle for use in a conductive paste. The metallized surfaces can include connections of a variety of shapes and sizes for any suitable surface mounted or non-surface mounted embodiment. Moreover, portions of one or more surfaces of the capacitor component can be metallized, or the entire surfaces of each of the surfaces of the capacitor module can be metallized. In this way, connections between the internal cathodes and anodes and the external cathodes and anodes can be achieved using one or more sides or surfaces of the capacitor module.

Manufacturing of the capacitor module can be performed according to one or more methods and embodiments discussed herein. In some embodiments, a method for manufacturing the capacitor module includes a step of anode pressing, where a metal powder is placed into a cavity and pressed in order to shape the metal powder into what will be the shape of an anodized pellet. For example, the metal powder can be formed into a square, rectangle, polygon, disc, ellipse, or any other suitable shape. The pressed metal powder or anodized pellet then undergoes a step of anode formation where an oxide film is formed to create a dielectric layer on the anodized pellet. Thereafter, a conductive polymer coating and/or graphite particles can be applied to the anodized pellet to form a cathode layer. For example, the cathode layer can include magnesium oxide, polystyrene sulfonate, polyaniline, polypyrrole, and/or any other suitable particles or compounds for providing a cathode layer. The anodized pellet can then undergo an anode silvering process wherein the anodized pellet is at least partially encapsulated by a conductive resin or epoxy. A conductive paste is applied to the anodized pellet or a substrate for the capacitor module in order to provide a medium to attach the anodized pellet to the substrate according to a certain pattern or arrangement. A pick and place operation can be used to transfer one or more anodized pellets onto the substrate for permanent placement. A molding compound is thereafter dispensed onto the substrate and one or more anodized pellets in order to seal the anodized pellets within what is now the capacitor module. Thereafter, a dicing processing is used to expose wires extending from one or more anodized pellets to one or more termination points on one or more outer surfaces of the capacitor module. The wires can be formed from the anodized pellets or separately included in the capacitor module for coupling the anodized pellets to one or more anode or cathode connections. Each of the one or more outer surfaces of the capacitor module can be metallized to create a conductive pathway from outside the capacitor module to the one or more anodized pellets inside the capacitor module. Metallization can be performed using one or more operations such as sputtering, spray coating, dip coating, or plating with metal, metal alloy and/or conductive resin. In some embodiments, an additional plating process is used in order to provide an additional conductive surface from which to mount or otherwise connect the capacitor module to an external connection. The additional plating can be formed from any suitable conductive material such as a metal (e.g., nickel or tin), an alloy, and/or a metal particle/fillet loaded resin material. The finished capacitor module can be fabricated to any suitable height or length from a PCB in the z-direction. For example, the capacitor module can have a height of approximately 1.0 millimeter. Additionally, in some embodiments, the height of the capacitor module can be less than 1.0 millimeter or greater than 1.0 millimeter.

The arrangement of the anodized pellets within the capacitor component can be set in a variety of ways. Additionally, the cathode and anode connections, both internal and external to the capacitor module can also be arranged in a variety of ways. For example, in some embodiments, a capacitor module can contain one or more anode and cathode connections and one or more anodized pellets for storing charge between each of the anode and cathode connections respectively. In other embodiments, multiple anode connections can be connected to an anodized pellet and/or multiple cathode connections can be connected to an anodized pellet.

These and other embodiments are discussed below with reference to FIGS. 1-24C; however, those skilled in the art will readily appreciate that the detailed description given herein with respect to these figures is for explanatory purposes only and should not be construed as limiting.

FIG. 1 illustrates a perspective view of a Y-capacitor 100. The Y-capacitor 100 can include terminal leads 102 separated by a separation angle 108 of approximately 90 degrees. The separation angle 108 is configured to accommodate single PCB designs where the Y-capacitor 100 is terminated in a single planar PCB. In this way, the terminal leads 102 will enter the PCB board in the same orientation. The Y-capacitor 100 can further include an epoxy 104 surrounding a dielectric plate 106. Despite the ability of the Y-capacitor to function in single planar PCBs, the Y-capacitor 100 occupies an unnecessary amount of space in multi-PCB devices. Additionally, in order to orient the Y-capacitor 100 in a multi-PCB operation, the terminal leads 102 must be bent multiple times in order to fit into the soldering holes of multiple PCBs concurrently. Unfortunately, bending the terminals can reduce the separation angle 108 thereby promoting arcing across the air gap between the terminal leads 102. Moreover, bending the terminal leads 102 can crack the epoxy 104 and potentially short the terminal leads 102. Therefore, a capacitor that can fit into multiple PCBs concurrently without risking damage to the capacitor or the PCB to which the capacitor is attached.

FIGS. 2A-2E illustrate embodiments of the axial lead capacitor 200 as discussed herein. The axial lead capacitor 200 includes terminal leads 204 that are axial for multiple PCBs. The terminal leads 204 can be configured to extend parallel but opposite directions away from the dielectric plate 208. The terminal leads 204 can be characterized as having a cross section that includes a flat surface or a round surface. The dielectric plate 208 can be circular or disc shaped. Additionally, the dielectric plate 208 can be elliptical, spherical, ellipsoidal, planar, polygonal, or any other suitable shape for storing charge. The dielectric plate 208 can be coated with an epoxy 206 in order to protect the dielectric plate 208 and prevent shorting. The dielectric plate 208 can include one or more conductive plates abutting the dielectric plate 208 in order to provide a region to solder and attach the terminal leads 204. The separation angle 210 between the terminal leads 204 can be between 120 and 180 degrees, or set to 180 degrees plus or minus 5 degrees. The separation angle can refer to an angle between two points where each of the terminal leads (102 or 204) initially extend from the dielectric plate 208 within the axial lead capacitor 200 or from the epoxy 206. In some embodiments, the terminal leads 204 extend from the dielectric plate 208 according to a single axis and the distal ends of the terminal leads 204 can terminate at opposite sides of the dielectric plate 208. The terminal leads 204 can be bendable or malleable in order to increase or decrease a distance between distal ends of the terminal leads. Moreover, the distal ends of the terminal leads 204 can be bent to terminate in any point in three-dimensional space subject to the length of the terminal leads. In some embodiments, the terminal leads 204 extend from the dielectric plate 208 according to different axes and the distal ends of the terminal leads 204 can terminate at opposite sides of the dielectric plate 208.

FIG. 2B illustrates a perspective view 212 of an embodiment of the axial lead capacitor 200 with notched terminal leads. Specifically, FIG. 2B sets forth the shape and orientation of a type of notch 214 that can be set in the terminal leads 204. For example, in some embodiments the notch 214 can be curved to reduce any sharp angles in the terminals leads 204. In other embodiments, the notch 214 can be defined by an angle of wire interposed between the ends of the terminal leads 204. Additionally, in yet other embodiments, the notch 214 can include two right angles in order to make a notch resembling a square or rectangle interposed between the ends of the terminal leads 204. One or more notches 214 can be in each terminal lead 204 in order to provide additional support when the axial lead capacitor 200 is placed into a solder hole. Additionally, the notches 214 can be included to provide preferred regions to bend the axial lead capacitor 200 in order to modify the separation angle 210. In this way, the notches 214 will receive much of the stress from bending rather than the epoxy 206.

FIG. 2C illustrates a top or bottom view 218 of the axial lead capacitor 200 without the epoxy 206 surrounding the dielectric plate 208. As illustrated in FIG. 2C, in some embodiments each terminal lead 204 can extend over and under the dielectric plate 208 along substantially the same axis or different axes in some embodiments. FIG. 2D illustrates a side view 220 of an embodiment of the axial lead capacitor 200 without epoxy 206 surrounding the dielectric plate 208. In FIG. 2D, the terminal leads 204 extend from the dielectric plate 208 in parallel and terminate in parallel, however, the terminal leads 204 do not occupy substantially the same axis. In FIG. 2E, a side view 222 of the axial lead capacitor 200 is provided with terminal leads 204 that extend and terminate along substantially the same axis. As illustrated in FIG. 2E, pre-bent terminal leads 216 can formed and soldered to the dielectric plate 208 or electrode of the dielectric plate 208 in order to ensure that the ends 224 of the pre-bent terminal leads 216 terminate along the same axis once coated with the epoxy 206. Furthermore, the terminal leads 204 and 216 of FIGS. 2A-2E can include cross-sections that have a surface that is curved, planar, or any other shape suitable for attaching the terminal leads 204 and 216 to the dielectric plate 208 and/or another component or circuit.

Figure 3A:
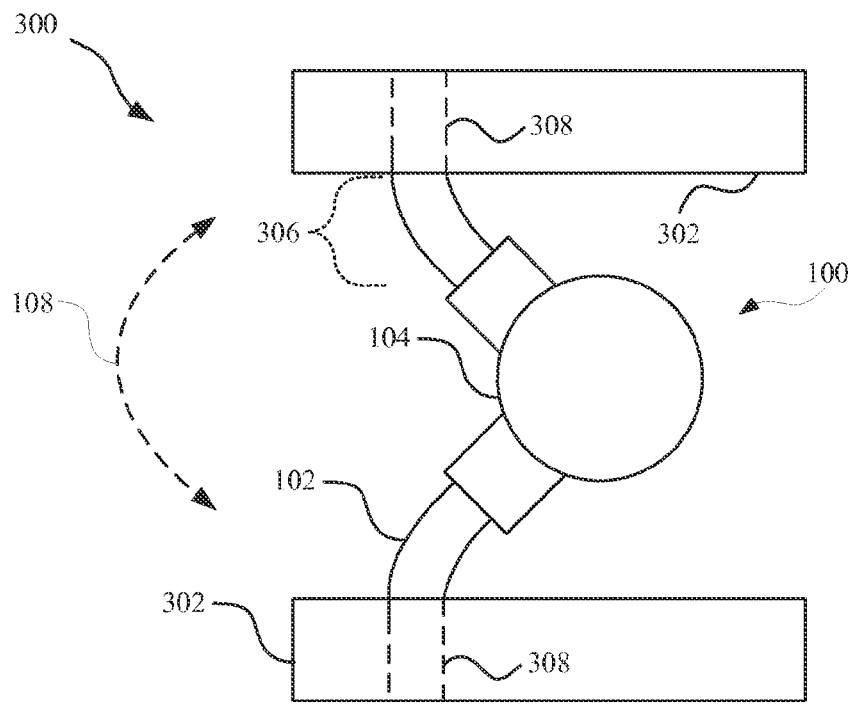
FIGS. 3A and 3B illustrate a perspective view of capacitors coupled between two printed circuit boards (PCBs).
Figure 3B:
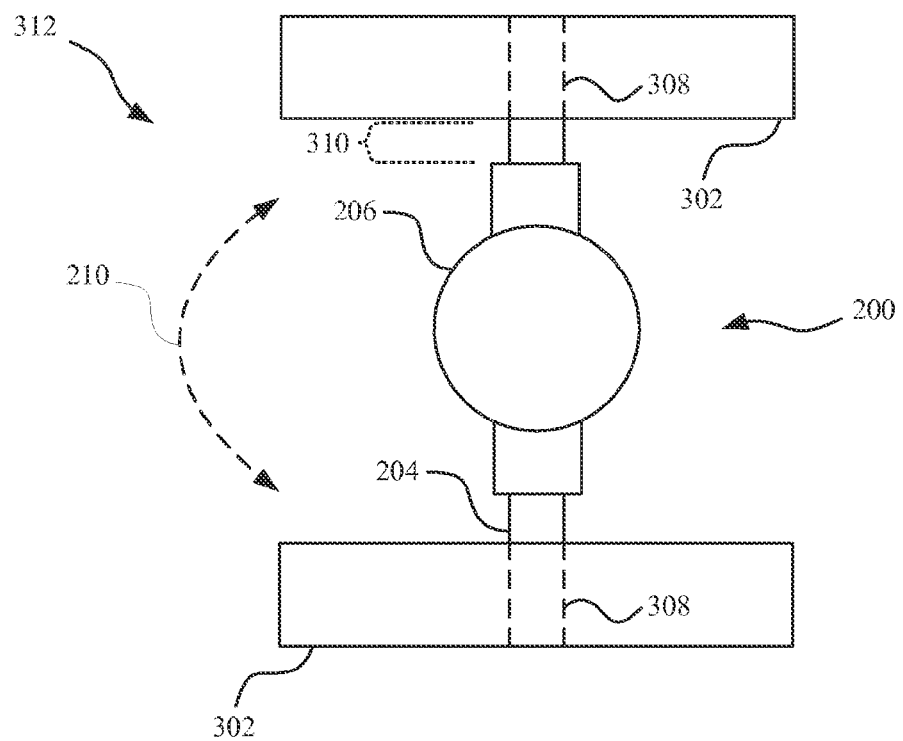

FIG. 3A illustrates a perspective view 300 of a Y-capacitor 100 bent between two PCBs 302. Specifically, FIG. 3A illustrates the terminal length 306 that is exposed and bent when a Y-capacitor is configured to connect between two PCBs 302. For example, when the PCBs 302 are configured in parallel with a Y-capacitor 100 in between the PCBs 302, the terminal leads 102 will necessarily require bending in order for the terminal leads 102 to fit within the solder holes 308. Alternatively, FIG. 3B illustrates a perspective view 312 of an embodiment of the axial lead capacitor 200 connected between two PCBs 302 that are substantially parallel. The embodiment set forth in FIG. 3B can be incorporated into a power supply for a computing device or battery charger in order to provide a compact circuit arrangement in the power supply. As illustrates in FIG. 3B, the terminal length 310 required for an axial lead capacitor 200 to fit between the parallel PCBs 302 is smaller compared to the terminal length 306 of FIG. 3A. This reduced terminal length 3010 is a result of the lack of bending required to fit the axial lead capacitor between two parallel PCBs 302. Additionally, the separation angle 108 of the Y-capacitor 100 between the PCBs is smaller than the separation angle 210 for the axial lead capacitor 200 thereby causing greater risk of arcing between the terminal leads 102 of the Y-capacitor 100. Moreover, if a design is made to include PCBs 302 that are even more close together than illustrated, the terminal leads 102 of the Y-capacitor 100 will need to bent at even sharper angles risking damage to the terminal leads 102 and the epoxy 104. However, the axial lead capacitor 200 can be more readily interposed between PCBs 302 that are closer together because no bending is required when the PCBs 302 are substantially parallel.

Figure 4A:
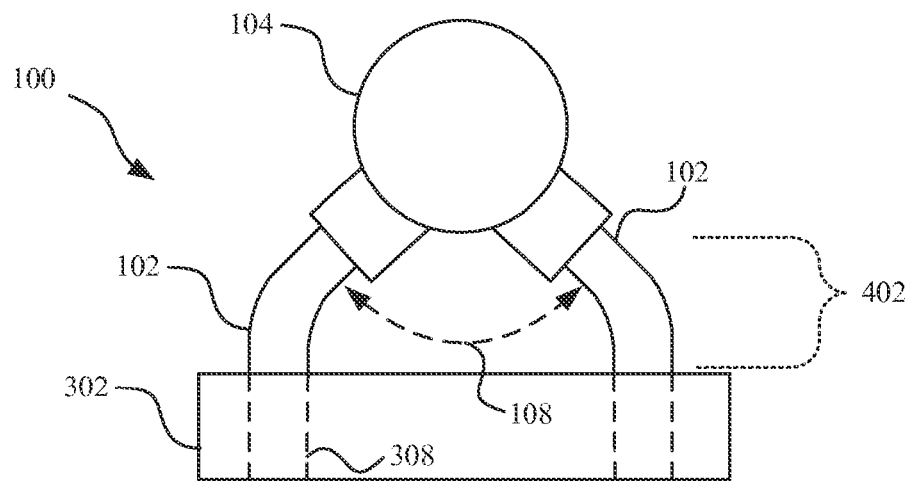
FIGS. 4A-4C illustrate the capacitors discussed herein electrically coupled to a PCB.
Figure 4B:
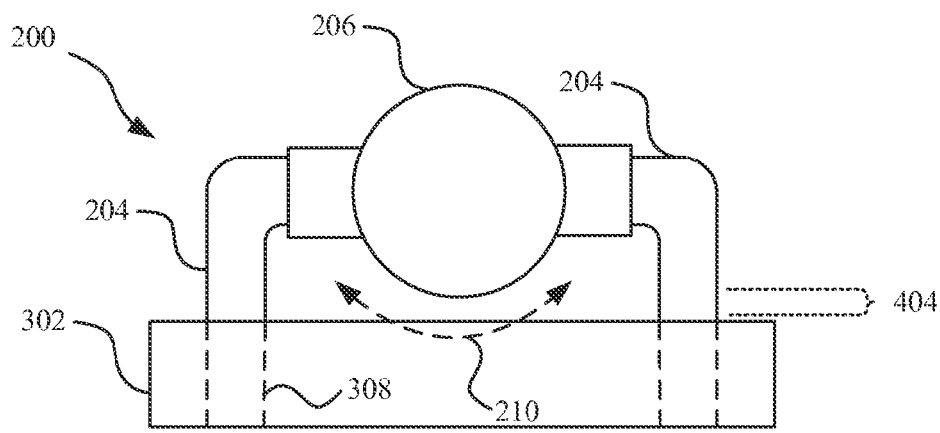
Figure 4C:
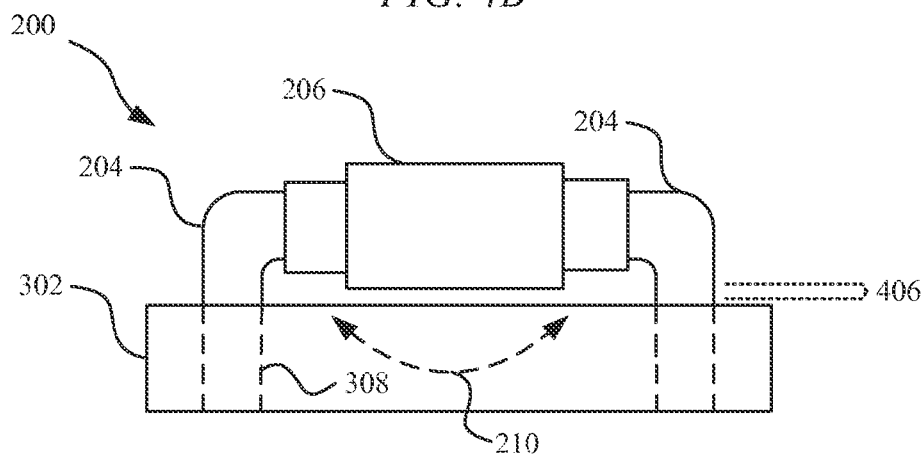

FIGS. 4A-4B illustrate the capacitors discussed herein electrically coupled to a PCB 302. Specifically, FIG. 4A illustrates a Y-capacitor 100 electrically coupled to a single planar PCB 302. The orientation of the Y-capacitor 100 is set by the manufacturer in order to accommodate single planar PCB 302 designs. In this way, the Y-capacitor 100 is forced to reside at a first offset 402 away from the PCB 302. Although the terminal leads 102 of the Y-capacitor 100 could be bent further and perhaps forced slightly closer to the PCB 302, the separation angle 108 prevents the Y-capacitor 100 from decreasing the first offset 402 to further allow the Y-capacitor 100 to be closer to the PCB 302. Alternatively, the axial lead capacitor 200, illustrated in FIG. 4B, can be set closer to the PCB 302 because of the larger angle of separation angle 210 of the axial lead capacitor 200. FIG. 4B illustrates an embodiment of the axial lead capacitor 200 wherein a surface of the epoxy 206 surrounding the dielectric is perpendicular to the PCB 302 and the terminal leads 204 are bent at substantially 90 degree angles for placement into the solder holes 308. In this way, a second offset 404 of the axial lead capacitor 200 is less than the first offset 402 of the Y-capacitor 100 because of the versatility of the terminal leads 204. Additionally, the separation angle 210 will be greater for the axial lead capacitor 200 in the single planar PCB 302 design of FIG. 4B in comparison to the separation angle 108 of the Y-capacitor 100 of FIG. 4A. FIG. 4C illustrates an embodiment where a surface of the epoxy 206 surrounding the dielectric of the axial lead capacitor 200 is substantially parallel to the PCB 302. In this way, a third offset 406 between the axial lead capacitor 200 is even smaller in comparison to the first offset 402 and the second offset 404. Moreover, even less of an air gap in the area defined by the separation angle 210 is provided thereby reducing the risk of arcing between the terminal leads 204. The reduced third offset 406 also allows for a smaller combined profile for both the PCB 302 and the axial lead capacitor 200. It should be noted that other configurations of the axial lead capacitor 200 are within the scope of this disclosure. For example, the embodiments illustrated in FIGS. 4B and 4C can be modified such that one terminal lead 204 of the axial lead capacitor 200 can be in a first PCB and another terminal lead 204 of the axial lead capacitor 200 can be electrically coupled to a second PCB that is parallel, perpendicular, or any other suitable orientation or angle with respect to the first PCB.

Figure 5A:
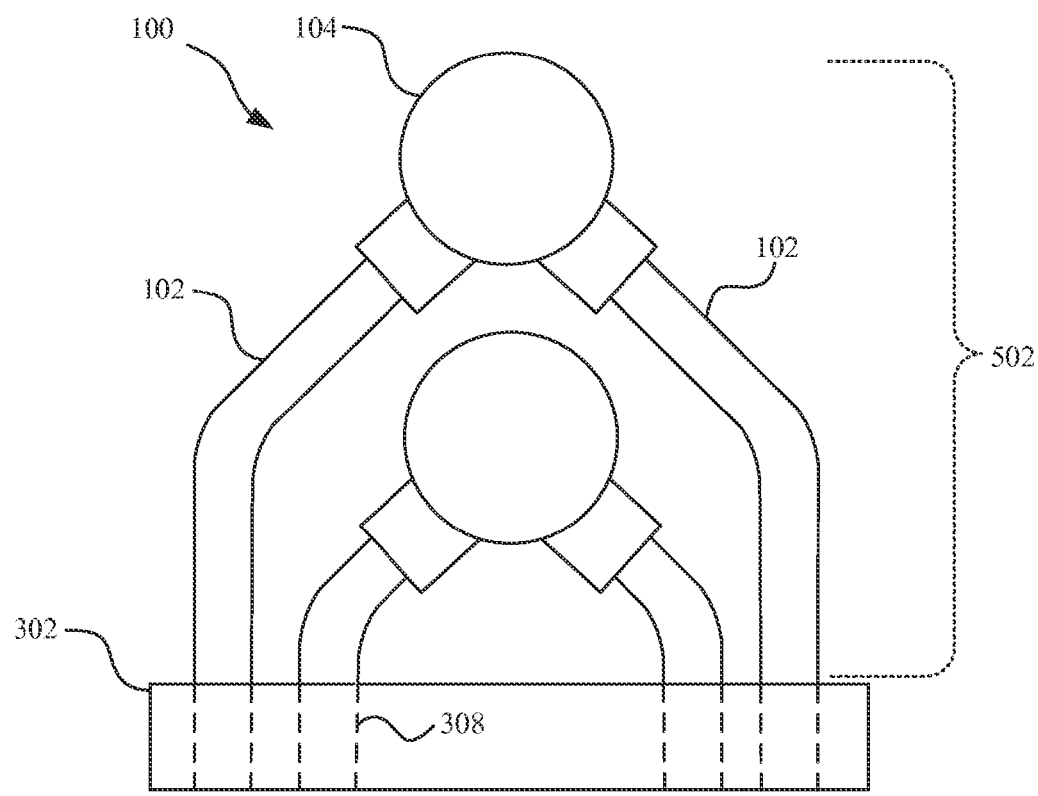
FIGS. 5A and 5B illustrate perspective views of capacitors stacked on a single planar PCB.
Figure 5B:
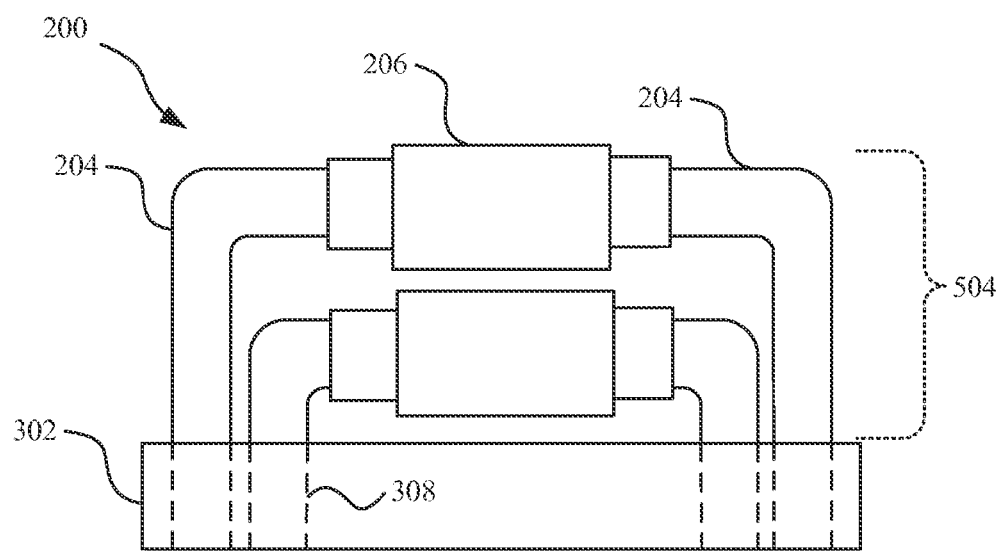

FIGS. 5A and 5B illustrate perspective views of capacitors stacked on a single planar PCB 302. Specifically, FIG. 5A illustrates multiple Y-capacitors 100 stacked on and electrically coupled to solder holes 308 of a PCB 302. Unfortunately, because of how the terminal leads 102 are orientated compared to the Y-capacitor 100, the height 502 of the Y-capacitors 100 will be relatively large relative to the height 504 of FIG. 5B. The difference in heights 502 and 504 are due to where the terminal leads 102 extend from the epoxy 104 surrounding the dielectric inside the Y-capacitor 100. In the Y-capacitor 100, the terminal leads 102 extend from one side or one half of the Y-capacitor 100, or one side or one half of the dielectric plate within the epoxy 104. However, as illustrated in FIG. 5B, the terminal leads 204 do not extend from one side or one half of the axial lead capacitor 200 or the dielectric plate within the epoxy 206 of the axial lead capacitor 200. In this way, multiple axial lead capacitors 200 are able to be stacked and connected to the PCB 302 in any suitable configuration without overly occupying the space above the PCB 302 where the majority of the axial lead capacitor 200 resides. For example, in some embodiments the axial lead capacitors 200 can be stacked such that the terminal leads 204 of a first axial lead capacitor are parallel, perpendicular, or any other suitable angle or orientation relative to a second axial lead capacitor 200. Additionally, the axial lead capacitors 200 can be stacked such that the terminal leads of each of the axial lead capacitor 200 extends in a parallel or perpendicular direction relative to the other axial lead capacitor 200 but terminate in different PCBs 302.

Figure 6A:
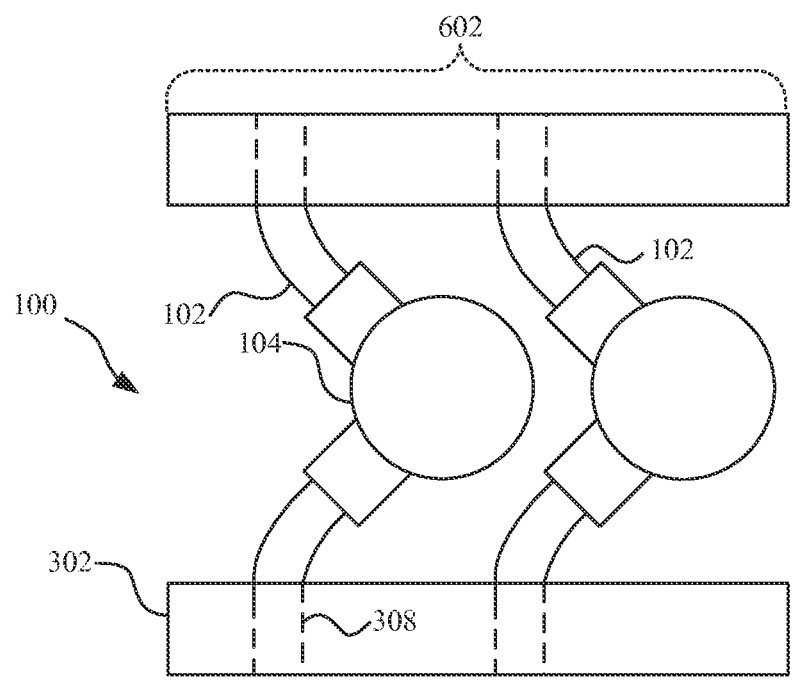
FIGS. 6A and 6B illustrate perspective views of adjacent capacitors connecting multiple parallel PCBs.
Figure 6B:
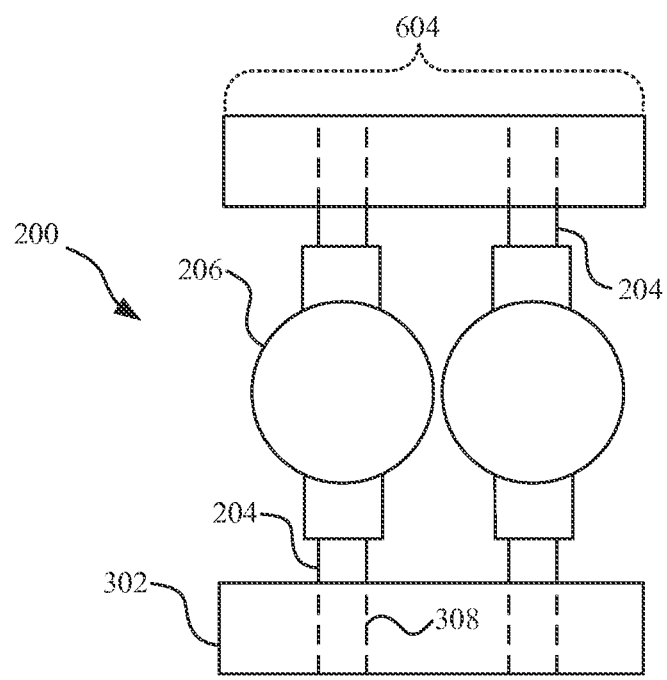

FIGS. 6A and 6B illustrate perspective views of adjacent capacitors connecting multiple parallel PCBs 302. Specifically, FIG. 6A illustrates a Y-capacitor 100 coupled between two parallel PCBs 302 and electrically fixed within multiple solder holes 308. A width 602 of the adjacent Y-capacitors 100 is illustrated to show how much space is occupied by the Y-capacitors 100 when they are fixed adjacent to one another. Comparatively, FIG. 6B illustrates an embodiment where multiple adjacent axial lead capacitors 200 are fixed between parallel PCBs in order to maximize the available space between the PCBs 302. In particular, the axial lead capacitors 200 occupy a smaller width 604 when fixed adjacent to each other between parallel PCBs 302 because the terminal leads 204 do not need to be bent in order to be fixed within the solder holes 308. In some embodiments, the width of each individual axial lead capacitor 200 is approximately 6 millimeters, therefore the smaller width 604 can be approximately 12 millimeters, or larger depending on the number of axial lead capacitors 200 that are configured adjacent to each other. Although FIGS. 6A and 6B illustrate embodiments where the planar surfaces of the epoxy for each adjacent capacitor do not face each other, it should be noted that both sets of capacitors (i.e., the Y-capacitors of FIG. 6A and the axial lead capacitors of FIG. 6B) still illustrate that the axial lead capacitors 200 occupy a smaller width on the PCB 302 than the Y-capacitors 100. Therefore, an embodiment where one of the planar surfaces of an axial lead capacitor 200 faces another planar surface of another axial lead capacitor 200, while concurrently providing an electrical connection between parallel PCBs 302, is within the scope of the present disclosure. The planar surface of an axial lead capacitor 200 can be a surface of the axial lead capacitor 200 that is parallel to a planar surface of the dielectric plate within the axial lead capacitor 200 (e.g., such as a portion of the epoxy 206).

Figure 7A:
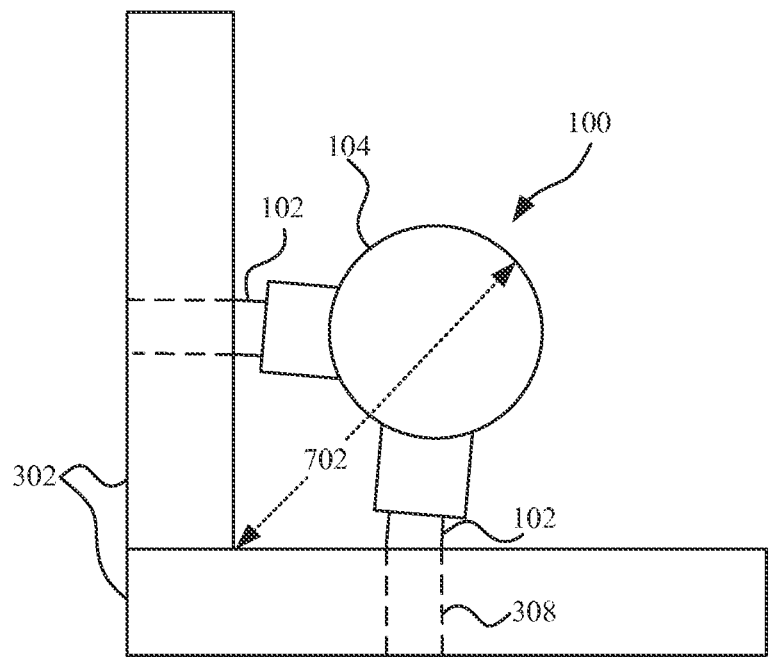
FIGS. 7A and 7B illustrate embodiments of capacitors electrically coupled between two non-parallel PCBs.
Figure 7B:
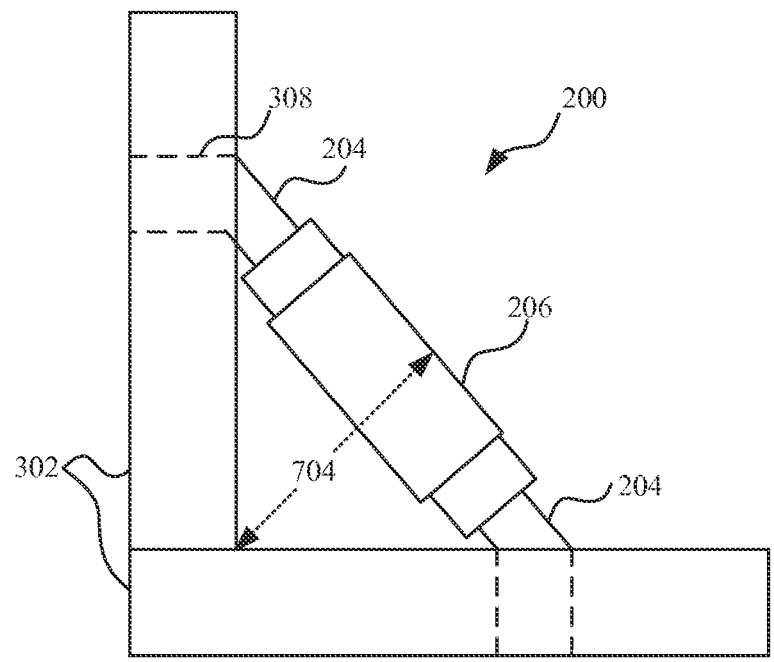

FIGS. 7A and 7B illustrate embodiments of capacitors electrically coupled between two non-parallel PCBs 302. Specifically, FIG. 7A illustrates a Y-capacitor 100 coupled to a solder hole 308 in a PCB 302 that is perpendicular to another PCB 302 that the Y-capacitor is also coupled to. This arrangement can be useful in devices having non-parallel PCBs 302 because of size and volume limitations. Unfortunately, the length 702 defining a distance from a point where the PCBs 302 meet and an edge of the Y-capacitor 100 epoxy 104 is relatively long compared to the length 704 of FIG. 7B. FIG. 7B illustrates an embodiment of non-parallel PCBs 302 being coupled by the axial lead capacitor 200 discussed herein. Because the axial lead capacitor 200 includes terminal leads 204 that extend parallel from the epoxy 206 in opposite directions, the axial lead capacitor 200 is able to conform to the corner created by the PCBs 302

(at an end of length 702 and 704) in order to occupy less space in the corner. Additionally, less space is wasted between the axial lead capacitor 200 and the corner of the PCBs when compared to the spaced left open by the Y-capacitor in the corner of the PCBs 302 in FIG. 7A. It should be noted that other orientations for the axial lead capacitor 200 in non-parallel PCB embodiments are within the scope of this disclosure. For example, in some embodiments a planar surface of the axial lead capacitor 200 can be flush or approximately flush against one of the PCBs 302 while concurrently being electrically couple to each PCB 302 in order to not waste space in the corner of the PCBs 302.

Figure 8A:
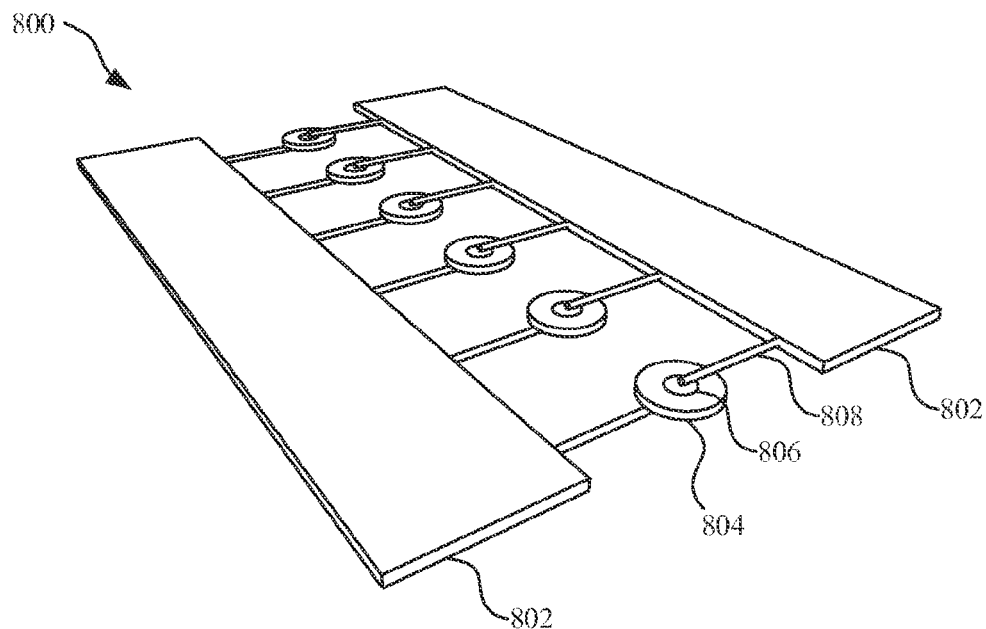
FIGS. 8A and 8B illustrate embodiments for manufacturing an axial lead capacitor as discussed herein.
Figure 8B:
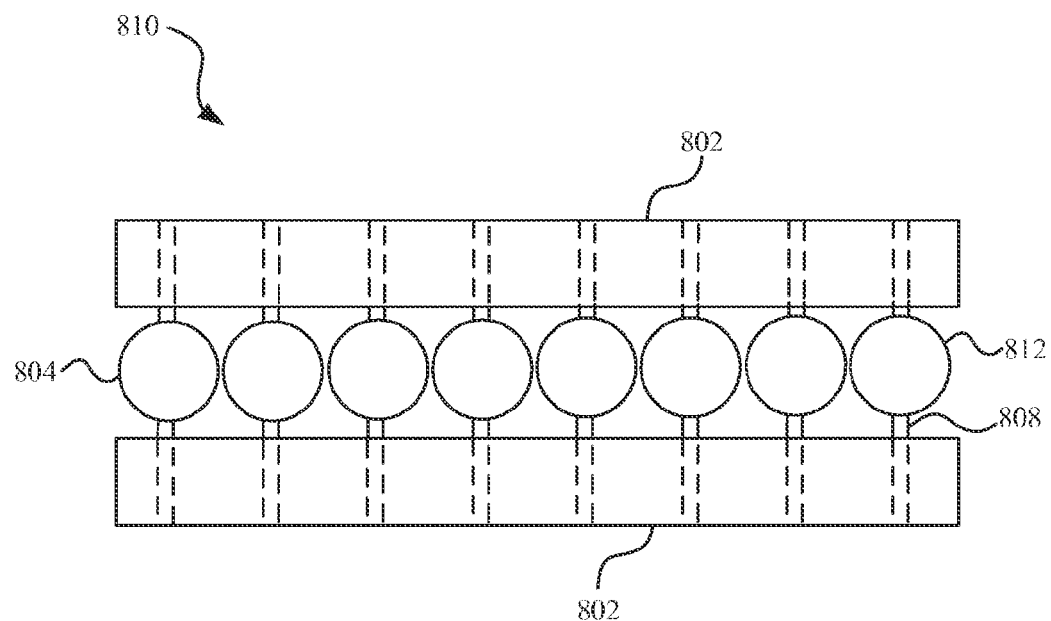

FIGS. 8A and 8B illustrate embodiments for manufacturing the axial lead capacitor 200 discussed herein. When manufacturing Y-capacitors 100, a single tape and reel system is used because the terminal leads terminate on a single side of the Y-capacitors 100. Therefore, in order to manufacture the axial lead capacitors 200, a different manufacturing system would need to be designed, as discussed herein. FIG. 8A illustrates a portion of a manufacturing system for producing the axial lead capacitors 200. Specifically, FIG. 8A sets forth a reel portion 800 including tape 802 that holds and protects the terminal leads 808 from being coated with epoxy. The reel portion 800 can be part of a manufacturing system for manufacturing the axial lead capacitors 200. The terminal leads 808 of the axial lead capacitors 200 can be electrically coupled to the dielectric plates 804 or a conductive plate abutting the dielectric plate 804 using solder 806. In this way, the terminal leads 808 and solder 806 can hold the dielectric plate 804 while the dielectric plate 804 is either submerged in a bath of resin or sprayed with resin in order to coat the dielectric plate 804, solder 806, and/or at least a portion of the terminal leads 808 with epoxy. The terminal leads 808 can be preformed into a bent configuration in order to align the ends of the terminal leads 808, extending from the dielectric plates 804, with a single axis. Additionally, the ends of the terminal leads 808 extending into the dielectric plates 804 can be formed into a flat configuration before soldering the terminal leads 808 to the dielectric plates 804. In other embodiments, the ends of the terminal leads 808 extending into the dielectric plates 804 can be formed into a round configuration. FIG. 8B illustrates a post-epoxy reel portion 810 where the resin 812 has covered only the dielectric plate 804 and a portion of the terminal leads 808 but has not covered the portion of the terminal leads 808 retained or covered by the tape 802. In some embodiments, only one terminal lead 808 of each axial lead capacitor 200 is covered by the tape 802 and the other terminal lead 808 of each axial lead capacitor 200 is covered individually but with a rubber sleeve, capsule, or sealing component. In this way, the axial lead capacitor 200 can be dipped or sprayed with resin 812 while a single line of tape 802 is adhesively affixed to one terminal lead 808 of each axial lead capacitor 200. The manufacturing system discussed herein can include one or more tapes 802 and reel portions 800 in order to iteratively or continuously dip each of dielectric plates 804 into a resin or spray each of the dielectric plates 804 with resin thereby coating the dielectric plates 804 with an epoxy seal.

Figure 9:
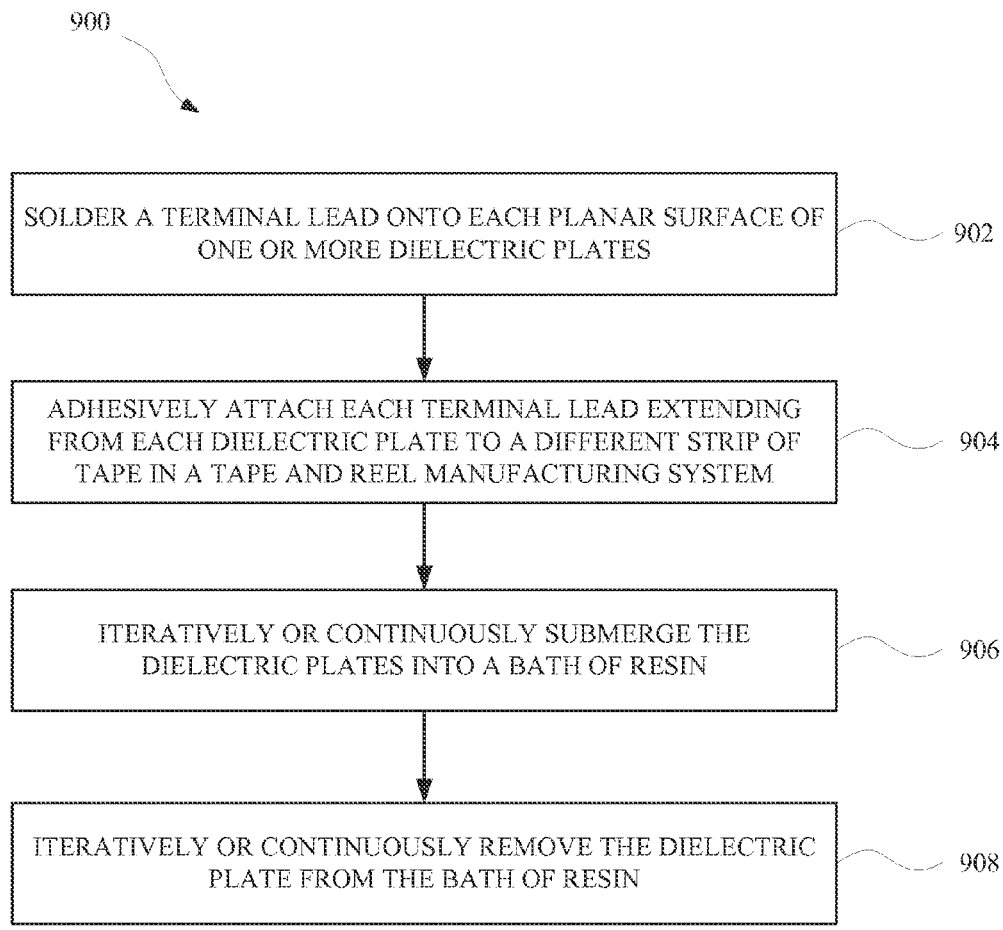
FIG. 9 illustrates a method for manufacturing an axial lead capacitor using a tape and reel system in combination with a resin bath.

FIG. 9 illustrates a method 900 for manufacturing an axial lead capacitor 200 using a tape and reel system in combination with a resin bath. The method 900 can be performed by any suitable manufacturing device, control system, or computer having a processor and a memory. The method 900 can include a step 902 of soldering a terminal lead onto each planar surface of one or more dielectric plates, or onto one or more conductive plates coupled to the one or more dielectric plates. At step 904, the method 900 includes adhesively attaching each terminal lead extending from the dielectric plate to a different strip of tape in a tape and reel manufacturing system (e.g., as illustrated in FIG. 8A). At step 906, the method 900 includes iteratively or continuously submerging the dielectric plates into a bath of resin. Additionally, the method 900 includes a step 908 of iteratively or continuously removing the dielectric plate from the bath of resin. It should be noted that the resin or epoxy discussed herein can be comprised of any suitable material for coating a dielectric plate of a capacitor. Moreover, the dielectric plate can be made of any suitable dielectric or capacitive material suitable for storing charge. The conductive plate discussed herein for providing a region to solder the terminal leads can also be made of any suitable material for receiving solder and coupling a terminal lead to a dielectric plate.

Figure 10:
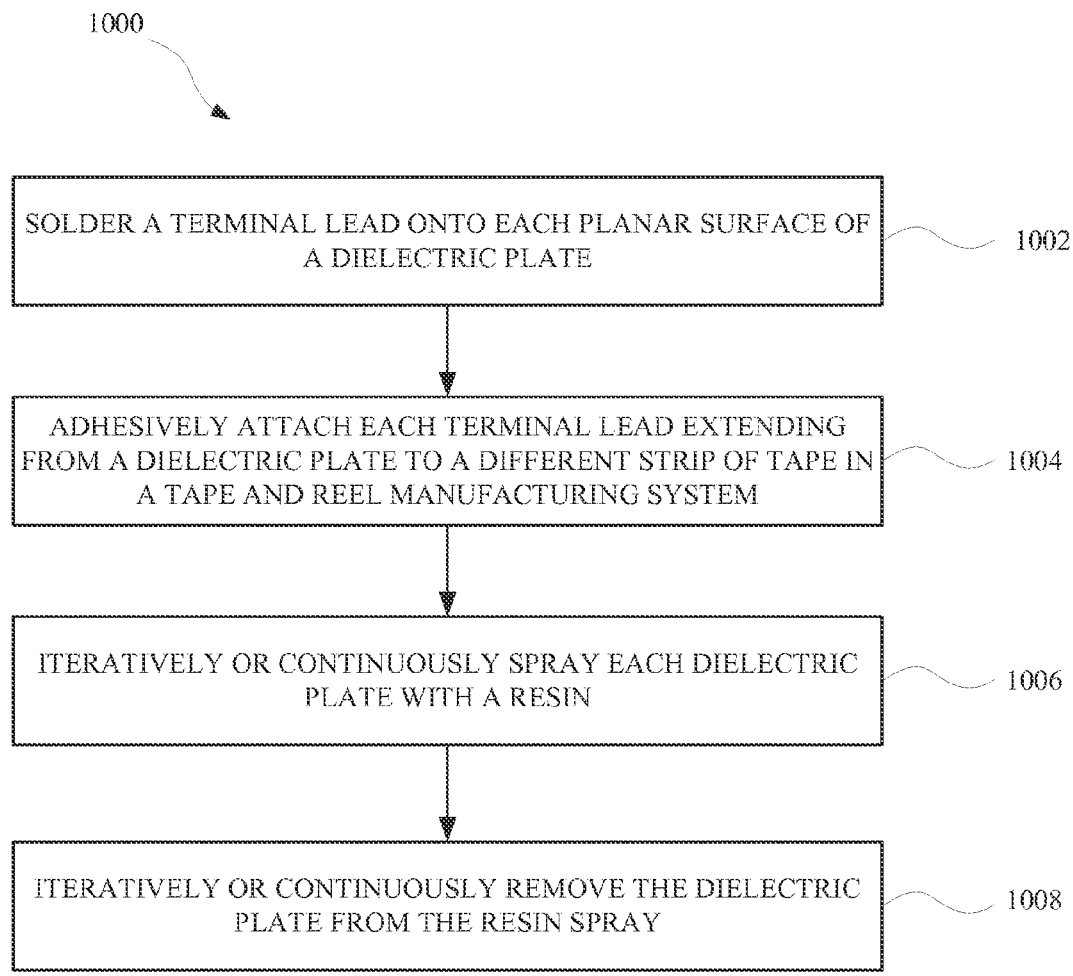
FIG. 10 illustrates a method for manufacturing an axial lead capacitor using a tape and reel system in combination with a resin spray system.

FIG. 10 illustrates a method 1000 for manufacturing an axial lead capacitor 200 using a tape and reel system in combination with a resin spray system. The method 1000 can be performed by any suitable manufacturing device, control system, or computer having a processor and a memory. The method 1000 includes a step 1002 of soldering a terminal lead onto each planar surface of one or more dielectric plates, or onto one or more conductive plates coupled to the one or more dielectric plates. The method 1000 can further include a step 1004 of adhesively attaching each terminal lead extending from the dielectric plate to a different strip of tape in a tape and reel manufacturing system (e.g., as illustrated in FIG. 8A). At 1006, the method includes iteratively or continuously spraying each dielectric plate with a resin material. The resin discussed herein with respect to the resin bath and resin spray corresponds to an epoxy that covers the dielectric plates after the resin undergoes post-processing, such as one or more heat treatments. At step 1008, the method 1000 includes iteratively or continuously removing the dielectric plate from the resin spray. Thereafter, the resin can be post-processed in order to further protect the dielectric plates.

Figure 11:
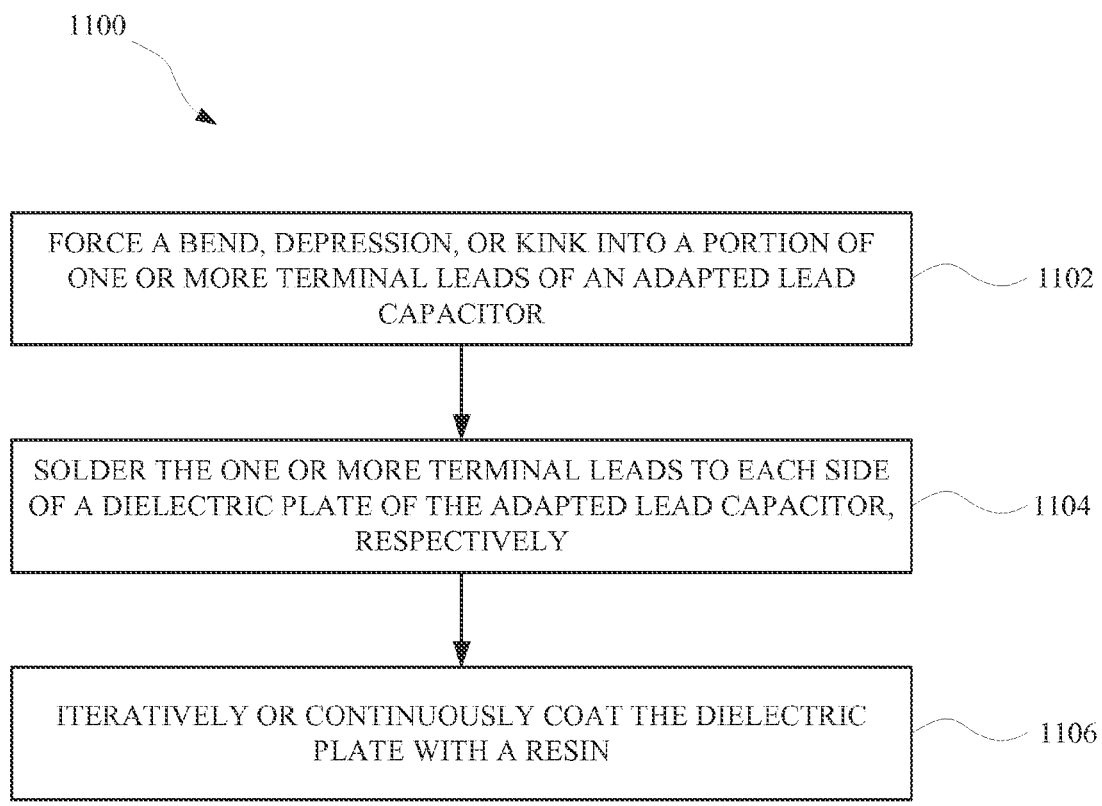
FIG. 11 illustrates a method for manufacturing an axial lead capacitor having a deformation at one or more of the terminal leads.

FIG. 11 illustrates a method 1100 for manufacturing an axial lead capacitor 200 having a deformation in one or more of the terminal leads. The method 1100 can be performed by any suitable manufacturing device, control system, or computer having a processor and a memory. The method 1100 can include a step 1102 of forcing a bend, depression, kink, or any other suitable shape or deformation into a portion of a terminal lead for an axial lead capacitor. The shape forced into the terminal lead should be configured to hold the dielectric plate offset from a PCB when a distal end of the terminal lead of the axial lead capacitor is set into a solder hole or other cavity of a circuit. The method 1100 can further include a step 1104 of soldering the terminal lead to each side of a dielectric plate, or onto a conductive plate coupled to dielectric plate. Additionally, the method 1100 can include a step 1106 of iteratively or continuously coating each dielectric plate with a resin. Thereafter, the resin can undergo post-processing to form an epoxy layer around the dielectric plate.

Figure 12:
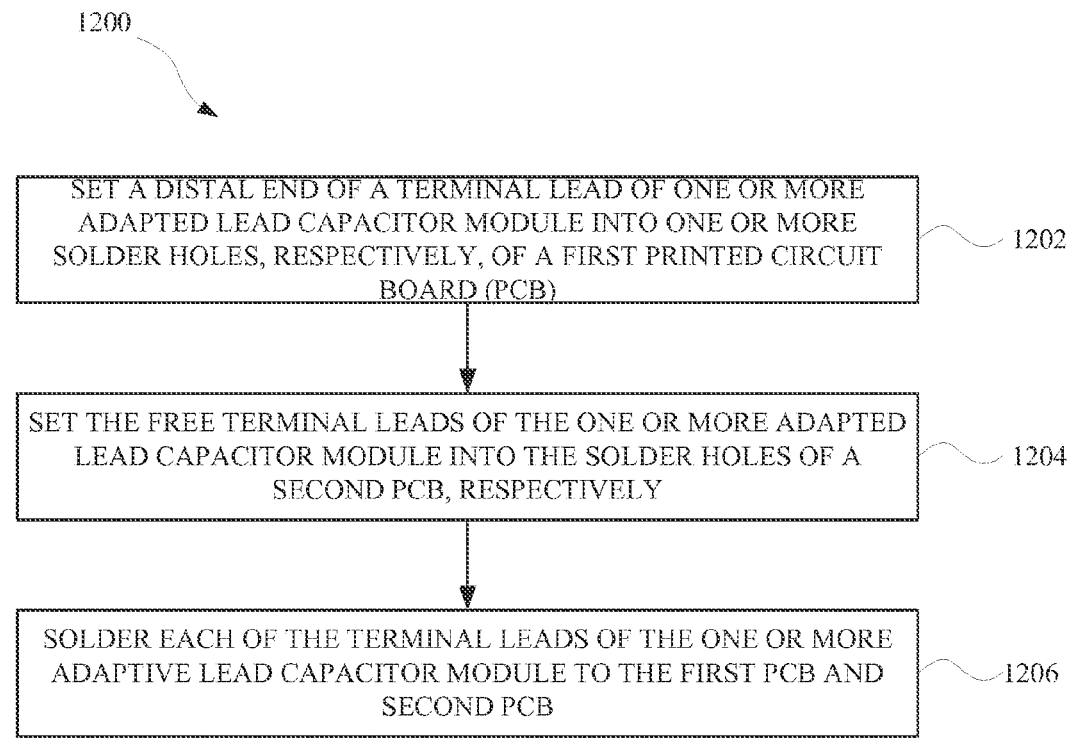
FIG. 12 illustrates a method for manufacturing a device having multiple parallel or non-parallel PCBs electrically coupled by one or more axial lead capacitors, as discussed herein.

FIG. 12 illustrates a method 1200 for manufacturing a device having multiple parallel or non-parallel PCBs electrically coupled by one or more axial lead capacitors, as discussed herein. The method 1200 can be performed by any suitable manufacturing device, control system, or computer having a processor and a memory. Additionally, any of the methods and steps discussed herein can be arranged in any suitable order or combined in any suitable combination. The method 1200 can include a step 1202 of setting one or more axial lead capacitors into one or more solder holes, respectively, of a first printed circuit board (PCB) (e.g., see FIGS. 3B, 4B, 4C, 6B, and/or 7B). The method 1200 can further include a step 1204 of setting the free terminal leads (those not set in a solder hole) of the one or more axial lead capacitors into solder holes of a second PCB, respectively. Additionally, the method 1200 can include a step 1206 of soldering each of the terminal leads of the one or more axial lead capacitors to the first PCB and the second PCB. It should be noted that the terminal leads placed in the first PCB can be soldered to the first PCB before the free terminal leads are soldered to the second PCB and vice versa.

Figure 13A:
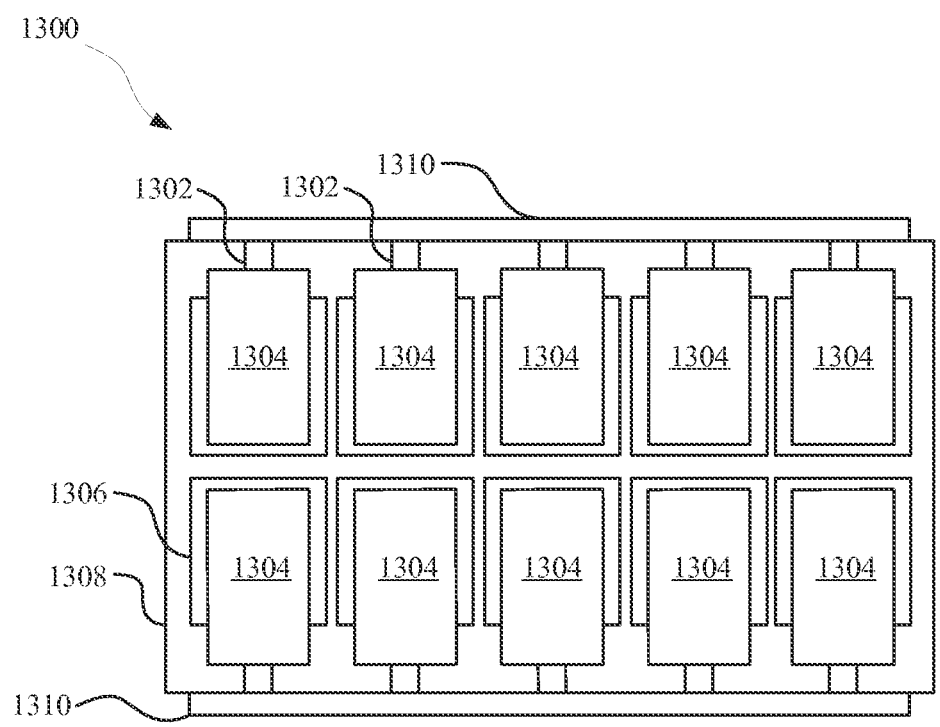
FIGS. 13A and 13B illustrate a top view and bottom view of multiple layers of a capacitor module according to some embodiments.
Figure 13B:
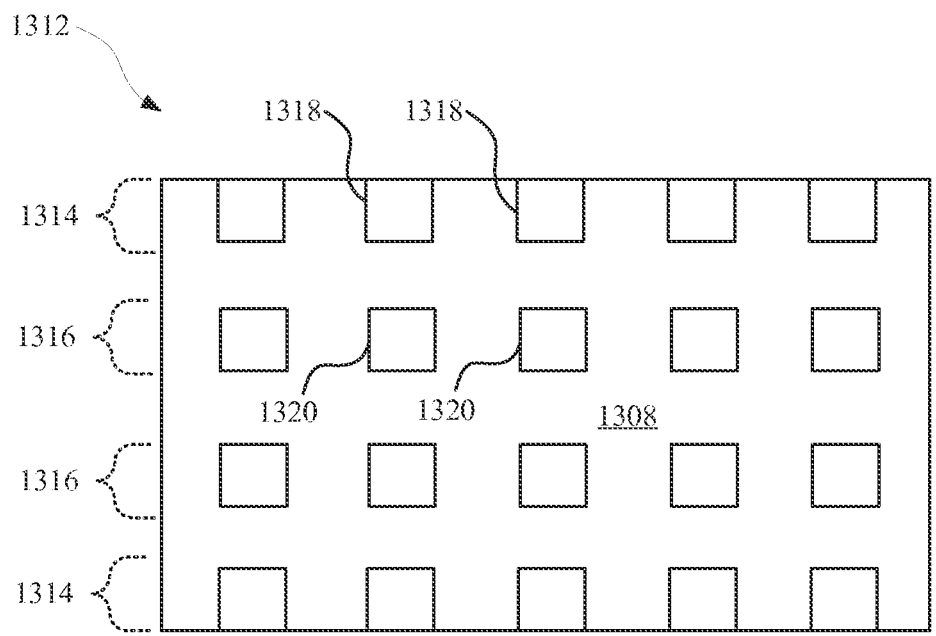

FIGS. 13A and 13B illustrate a top view 1300 and bottom view 1312 of multiple layers of a capacitor module according to some embodiments. Specifically, FIG. 13A illustrates a top view 1300 and cross-sectional view of the internal and external connections of the capacitor module. The capacitor module can include one or more anodized pellets 1304 arranged in any suitable configuration inside the capacitor module. One or more wires 1302 can be configured to connect the anodized pellets 1304 to an anode connection 1310 on a side surface of the capacitor module. Each of the one or more anodized pellets 1304 can overlap and abut one or more conductive traces 1306 on the substrate 1308 within the capacitor module in order to provide a connection from the anodized pellets 1304 to a cathode connection on an external surface of the capacitor module. FIG. 13B illustrates a bottom view 1312 of the capacitor module. Specifically, FIG. 13B sets forth the arrangement of the external anode connections 1318 and external cathode connections 1320 of the capacitor module. The external anode connections 1318 can be arranged in one or more anode rows 1314 at the bottom of the substrate 1308 of the capacitor module. Additionally, the external cathode connections 1320 can be arranged in one or more cathode rows 1316 at the bottom of the capacitor module. A conductive pathway between the anode connections 1310 and the external anode connections 1318 is provided to establish an anode connection at the side surface and/or the bottom surface of the capacitor module. The embodiment of the capacitor module illustrated in FIGS. 13A and 13B is suitable for surface mounting the capacitor module onto a PCB, however, other embodiments discussed herein enable the capacitor module to be operable without surface mounting the capacitor module. In this way, the connections to the anodes and cathodes of the capacitor module can be provided exclusively at the side surface of the capacitor module. The side surface can be the surfaces of the capacitor module substantially perpendicular to the PCB when the capacitor module is coupled to one or more electrical connections on the PCB. It should be noted that the term coupled, or electrically coupled, can refer to when a component is abutting another component or a conductive pathway exists between a component and another component.

Figure 14:
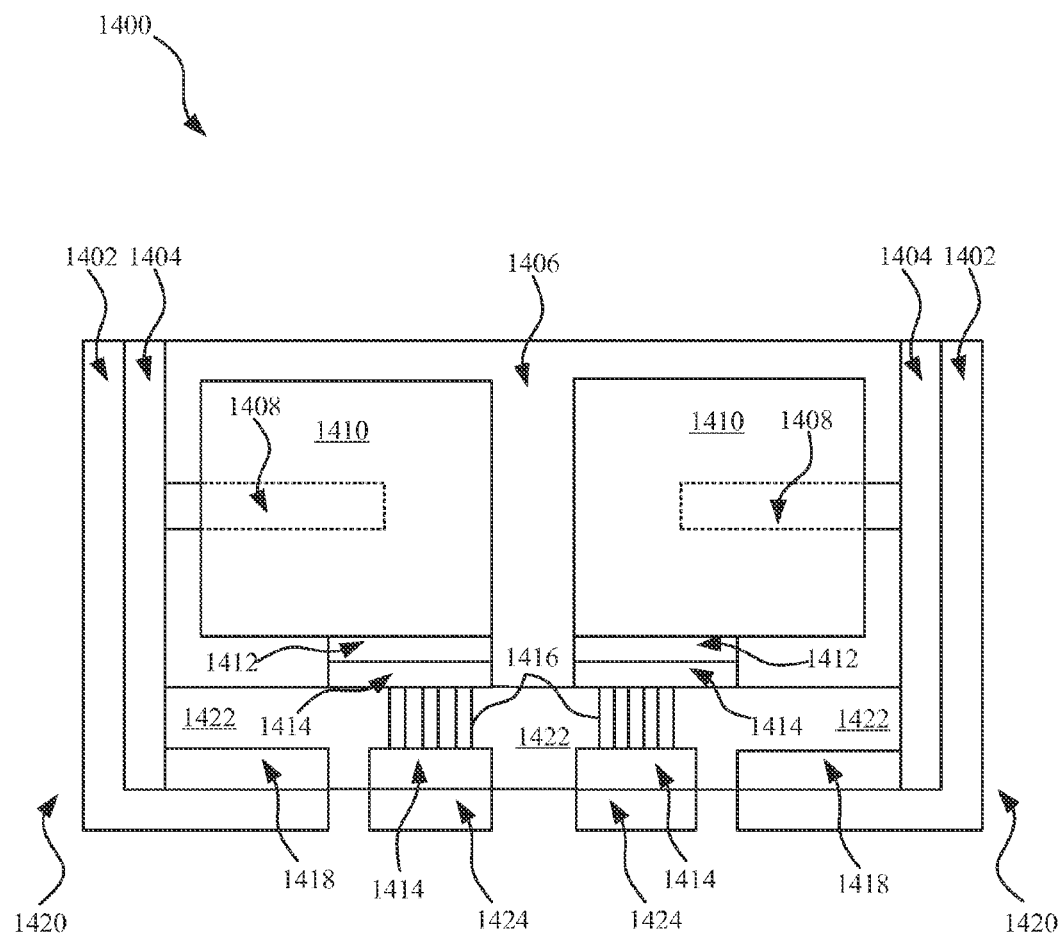
FIG. 14 illustrates a cross-sectional view of the capacitor module according to some embodiments discussed herein.

FIG. 14 illustrates a cross-sectional view 1400 of the capacitor module according to some embodiments discussed herein. Specifically, FIG. 14 illustrates the various internal and external elements and connections of the capacitor module. In some embodiments, the capacitor module can include one or more conductive plates 1402 located at the side surfaces 1420. The conductive plates can be formed from any suitable conductive material such as a metal (e.g., nickel, copper, tin, or any other suitable metal), an alloy, and/or a metal particle/fillet loaded resin material. Additionally, the capacitor module can include one or more metallized surfaces 1404. The metallized surfaces 1404 can be formed by sputtering or printing the metallized surfaces 1404 on any desired surface of the capacitor module. In this way, the metallized surfaces 1404 can serve as an anode or cathode connection to the PCB according to some embodiments discussed herein. The capacitor module can further include one or more wires 1408 that can provide a connection from the metallized surfaces 1404 to the anodized pellet 1410. The anodized pellet 1410 is formed according to one or more manufacturing methods discussed herein and configured inside the capacitor module to provide at least some of the charge storage capabilities of the capacitor module. The anodized pellets 1410 can be surrounded by a molding compound 1406. The molding compound 1406 can be made from any suitable material for retaining and protecting a dielectric material inside of a capacitor. Moreover, the anodized pellet 1410 can be configured to abut or be connected to a conductive paste 1412 set between the anodized pellet 1410 and a first conductive trace 1414 of the substrate 1422. The conductive paste 1412 can include particles such as palladium, silver, and/or any other suitable conductive particle for use in a conductive paste. However, the conductive paste 1412 can be optional in some embodiments. The first conductive trace 1414 can extend from the conductive paste 1412 or anodized pellets 1410 at a non-PCB side of the substrate 1422, through the vias 1416, and terminate at a PCB side of the substrate 1422. The vias 1416 can be plated or filled through-holes in the substrate 1422 to provide electrical connections between one or more areas or surfaces of the substrate 1422. The first conductive trace 1414 at the PCB side of the substrate 1422 can abut or be connected to a surface connection 1424. In this way, the surface connections 1424 can be an external cathode connection in some embodiments, in order to connect the capacitor module to a cathode connection on a PCB. Additionally, the conductive plates 1402 and/or metallized surfaces 1404 can be coupled to a second conductive trace 1418 in order to provide an external anode connection to connect the capacitor module to an anode connection on a PCB.

Figure 15:
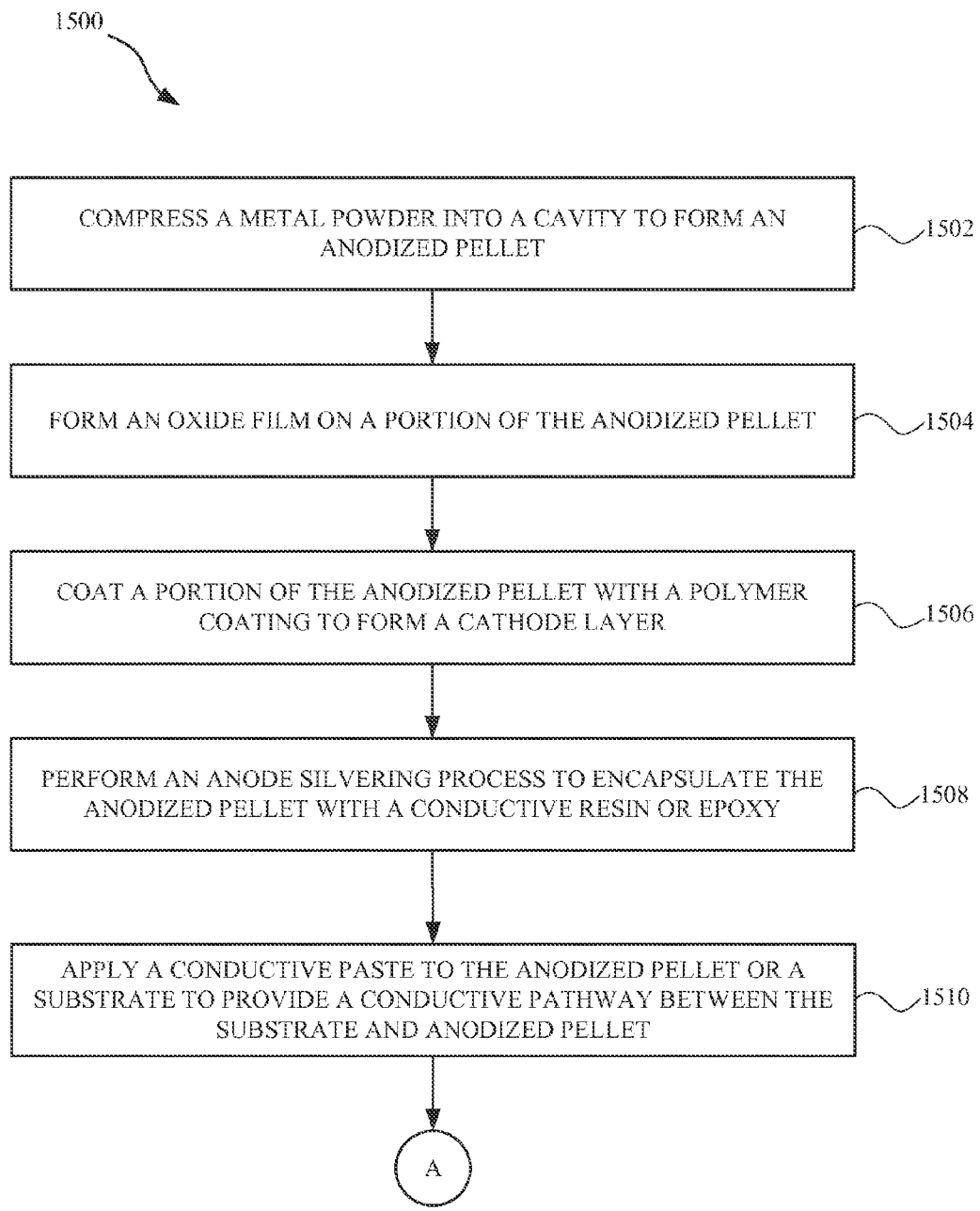
FIG. 15 illustrates a method of manufacturing the capacitor module discussed herein.

FIG. 15 illustrates a method 1500 of manufacturing the capacitor module discussed herein. The method 1500 can be performed by any suitable manufacturing device, control system, and/or computer having a processor and a memory. The method 1500 can include a step 1502 of compressing a metal powder into a cavity to form an anodized pellet. At step 1504, an oxide film is formed on a portion of the anodized pellet. At step 1506, a portion of the anodized pellet is coated with a polymer coating to form a cathode layer. At step 1508, an anode silvering process is performed on the anodized pellet in order to encapsulate the anodized pellet with a conductive resin or epoxy. At step 1510, a conductive paste is applied to the anodized pellet or a substrate to provide a conductive pathway between the substrate and the anodized pellet. It should be noted that the method 1500 continues to FIG. 16 according to the transition point "A" illustrated in both FIGS. 15 and 16.

Figure 16:
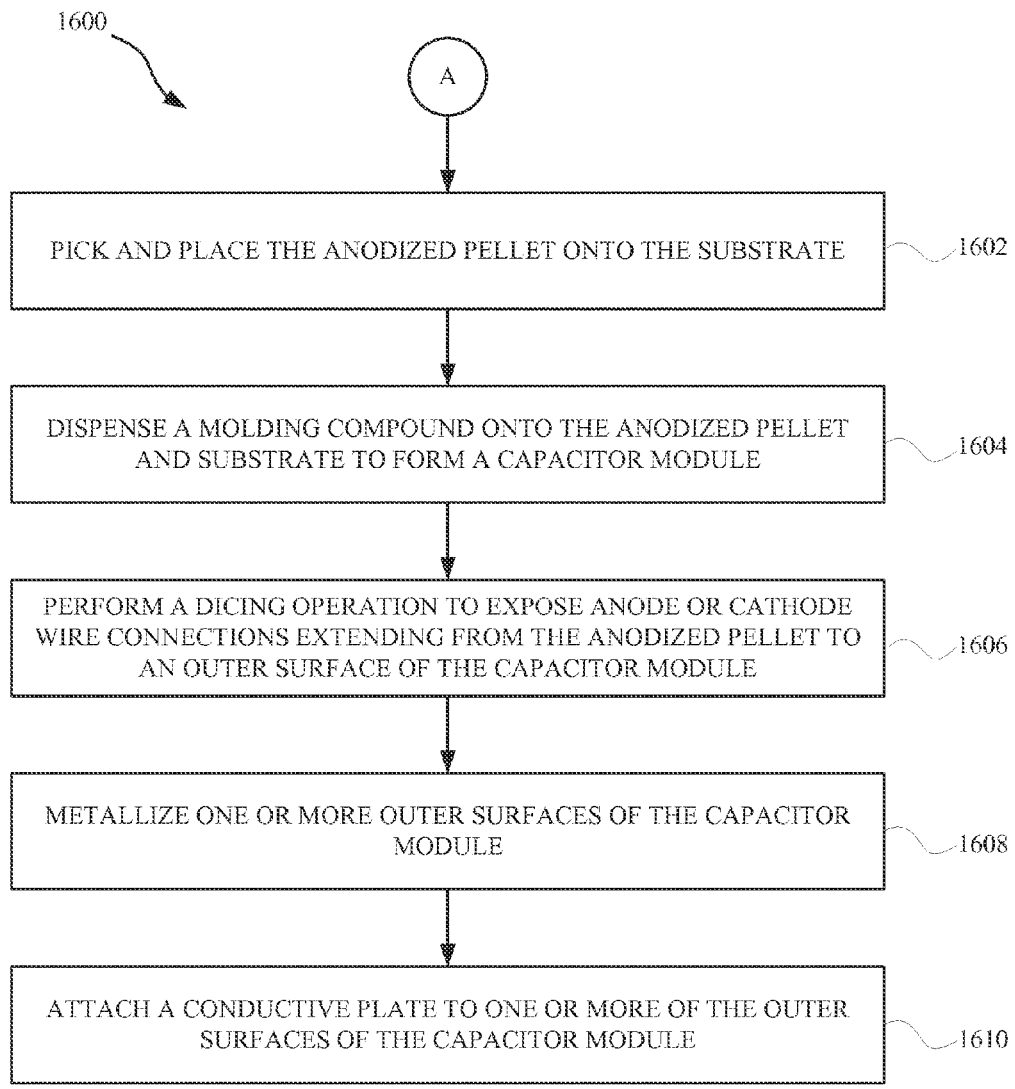
FIG. 16 illustrates a continuation of the method from FIG. 15 for manufacturing a capacitor module.

FIG. 16 illustrates a continuation of method 1500 from FIG. 15 for manufacturing a capacitor module. The method 1600 can be performed by any suitable manufacturing device, control system, and/or computer having a processor and a memory. The method 1600 can include a step 1602 of picking and placing one or more anodized pellets onto the substrate. The method can further include a step 1604 of dispensing a molding compound onto the anodized pellet and substrate to form a capacitor module. At step 1606, a dicing operation is performed in order to expose one or more anode and/or cathode wire connections extending from the anodized pellet to an outer surface of the capacitor module. The wires can be formed from a portion of the anodized pellet or separately placed within the molding compound to provide a conductive pathway from the anodized pellet to an outer surface of the capacitor module. At step 1608, one or more of the surfaces of the capacitor module are metallized as further discussed herein. At step 1610, which is an optional step, a conductive plate can be attached to one or more of the outer surfaces of the capacitor module.

FIGS. 17A-17C illustrate an embodiment of a surface mounted capacitor module discussed herein. The top view 1700 of FIG. 17A sets forth the orientation of ten anodized pellets 1304 within the capacitor module. Although a distinct number of pellets are discussed with respect to one or more embodiments herein, it should be noted that any number of anodized pellets can be included in the capacitor module for any suitable application or device. According to FIG. 17A, the capacitor module can include ten wires 1302 connecting the anodized pellets 1304 to the anode connections 1310. The capacitor module can further include ten isolated conductive traces 1306 arranged on the substrate 1308 and abutting the anodized pellets 1304. The bottom view 1702 of FIG. 17B illustrates the external anode connections 1318 and the external cathode connections 1320. Additionally, the side view 1704 of FIG. 17C illustrates an arrangement of the components of the capacitor module (as discussed in FIG. 14) through a cross-sectional view of the capacitor module.

FIGS. 18A-18C illustrate an embodiment of a surface mounted capacitor module discussed herein. The top view 1800 of FIG. 18A sets forth the orientation of ten anodized pellets 1304 within the capacitor module. The capacitor module can include ten wires 1302 connecting the anodized pellets 1304 to the anode connection 1310. The capacitor module can further include ten isolated conductive traces 1306 arranged on the substrate 1308 and abutting the anodized pellets 1304. The bottom view 1802 of FIG. 18B illustrates the external anode connections 1318 each configured in approximately a semi-circle, and the external cathode connections 1320. Additionally, the side view 1804 of FIG. 18C illustrates an arrangement of the components of the capacitor module (as discussed and defined in FIG. 14) through a cross-sectional view of the capacitor module.

FIGS. 19A-19C illustrate an embodiment of a surface mounted capacitor module discussed herein. The top view 1900 of FIG. 19A sets forth the orientation of ten anodized pellets 1304 within the capacitor module. The capacitor module can include ten wires 1302 connecting the anodized pellets 1304 to the anode connection 1310. The capacitor module can further include five conductive traces 1306 each arranged on the substrate 1308 to provide a conductive pathway between at least two anodized pellets 1304. The bottom view 1902 of FIG. 19B illustrates the external anode connections 1318 each configured in approximately a semi-circle, and the external cathode connections 1320. The five external cathode connections 1320 each provide a connection to each of the conductive traces 1306. Additionally, the side view 1904 of FIG. 19C illustrates the arrangement of the components of the capacitor module (as discussed and defined in FIG. 14) through a cross-sectional view of the capacitor module.

Figure 20B:
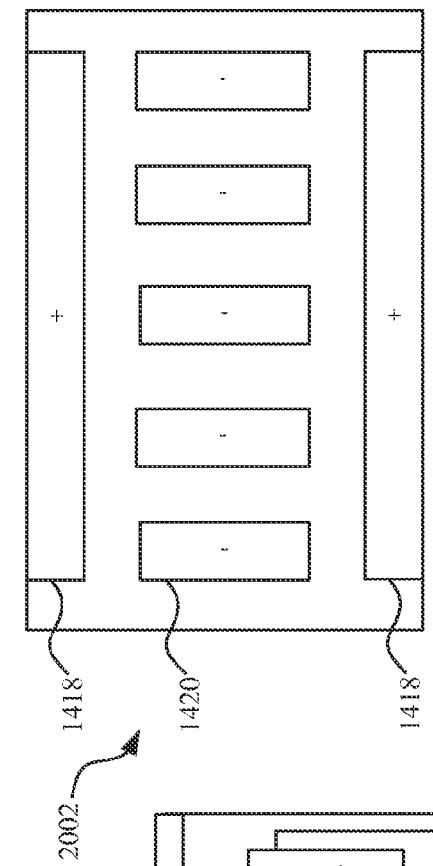
FIGS. 20A-20C illustrates an embodiment of a surface mounted capacitor module discussed herein.
Figure 20C:
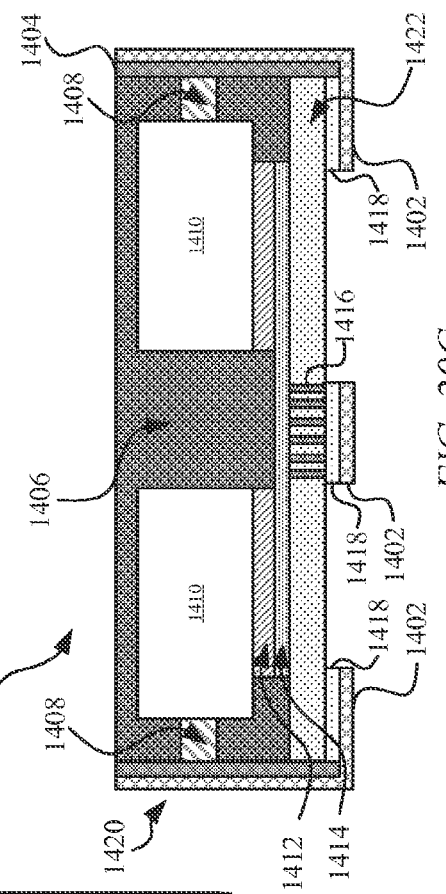
Figure 20A:
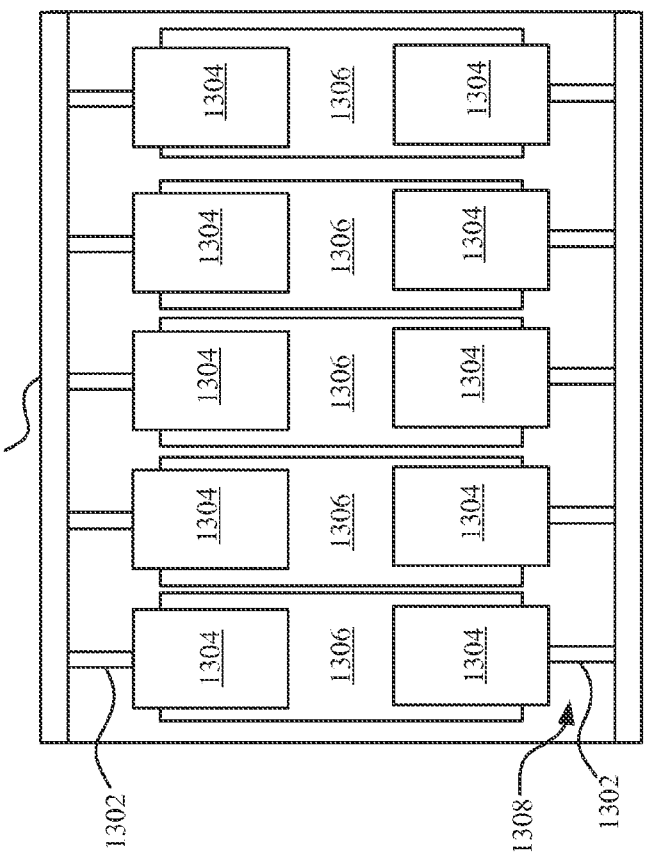

FIGS. 20A-20C illustrate an embodiment of a surface mounted capacitor module discussed herein. The top view 2000 of FIG. 20A sets forth the orientation of ten anodized pellets 1304 within the capacitor module. The capacitor module can include ten wires 1302 connecting the anodized pellets 1304 to the anode connection 1310. The capacitor module can further include five conductive traces 1306 each arranged on the substrate 1308 to provide a conductive pathway between at least two anodized pellets 1304. The bottom view 2002 of FIG. 20B illustrates the external anode connections 1318 and the external cathode connections 1320. The external anode connections 1318 are each configured to extend along a majority of a side length of the capacitor module. The external cathode connections 1320 each provide a connection to each of the conductive traces 1306 respectively. Additionally, the side view 2004 of FIG. 20C illustrates the arrangement of the components of the capacitor module (as discussed and defined in FIG. 14) through a cross-sectional view of the capacitor module.

FIGS. 21A-21C illustrate an embodiment of a surface mounted capacitor module discussed herein. The top view 2100 of FIG. 21A sets forth the orientation of ten anodized pellets 1304 within the capacitor module. The capacitor module can include ten wires 1302 connecting the anodized pellets 1304 to the anode connection 1310. The capacitor module can further include five conductive traces 1306 each arranged on the substrate 1308 to provide a conductive pathway between at least two anodized pellets 1304. The bottom view 2102 of FIG. 21B illustrates the external anode connections 1318 and an external cathode connection 1320. The external anode connections 1318 are each configured to extend along a majority of a side length of the capacitor module. The external cathode connection 1320 is configured to provide a connection to each of the conductive traces 1306 from a PCB on which the capacitor module can be coupled. Additionally, the side view 2104 of FIG. 21C illustrates the arrangement of the components of the capacitor module (as discussed and defined in FIG. 14) through a cross-sectional view of the capacitor module.

FIGS. 22A-22C illustrate an embodiment of a non-surface mounted capacitor module discussed herein. The top view 2200 of FIG. 22A sets forth the orientation of the anodized pellets 1304 within the capacitor module according to some embodiments. The anodized pellets 1304 can be arranged in any suitable arrangement for providing a charge storage within the non-surface mounted capacitor module. The capacitor module can include a plurality of wires 1302 connecting the anodized pellets 1304 to the external anode connection 1318. The capacitor module can further include conductive traces 1306 each arranged on the substrate 1308 to provide a conductive pathway from one or more anodized pellets 1304 to the external cathode connection 1320. The bottom view 2202 of FIG. 22B illustrates the external anode connections 1318 and the external cathode connections 1320. It should be noted that no vias or through-holes are included in the substrate 1422 because the capacitor module is configured to not be surface mounted. Rather, all the external anode connections 1318 and the external cathode connections 1320 can be exclusively at the side surfaces of the capacitor module rather than the bottom surface that face the PCB when connected to the PCB. In this way, the non-surface mounted capacitor module can be configured to abut the PCB or hover above the PCB when connected to the PCB. For example, the side surfaces 1420 of the non-surface mounted capacitor module can be held by a mechanical device such as a terminal plate or spring in order to apply a force against the sides of the non-surface mounted capacitor module to keep the non-surface mounted capacitor module in place on or above a surface of the PCB. The terminal plate and/or spring can also be configured to provide an electrical connection from the external anode connections 1318 and the external cathode connections 1320 to the PCB. The side view 2204 of FIG. 22C illustrates the arrangement of the components of the capacitor module (as discussed and defined in FIG. 14) through a cross-sectional view of the capacitor module. It should be noted that although FIG. 14 sets forth a surface mounted capacitor module, some of the elements of FIG. 14 are also included in the non-surface mounted capacitor module as set forth in FIGS. 22A-22C. However, features such as the surface connections 1424 and the vias 1416 are not included in the non-surface mounted capacitor module of FIGS. 22A-22C. Additionally, the metallized surfaces 1404 and conductive plates 1402 are set forth as two overlapping layers, however, the conductive plates 1402 can be optional in some embodiments of the non-surface mounted capacitor module.

FIGS. 23A-23C illustrate an embodiment of a non-surface mounted capacitor module discussed herein. The top view 2300 of FIG. 23A sets forth the orientation of the anodized pellets 1304 within the capacitor module according to some embodiments. The anodized pellets 1304 can be arranged in any suitable arrangement for providing a charge storage within the non-surface mounted capacitor module. The capacitor module can include a plurality of wires 1302 connecting the anodized pellets 1304 to the external anode connection 1318. The capacitor module can further include conductive traces 1306 each arranged on the substrate 1308 to provide a conductive pathway from one or more anodized pellets 1304 to the external cathode connection 1320. The bottom view 2302 of FIG. 23B illustrates the external anode connections 1318 and the external cathode connections 1320. It should be noted that no vias or through-holes are included in the substrate 1422 because the capacitor module is configured to not be surface mounted. Rather, all the external anode connections 1318 and the external cathode connections 1320 are at the side surfaces of the capacitor module rather than the bottom surface. In this way, the non-surface mounted capacitor module can be configured to abut the PCB or hover above the PCB when connected to the PCB, as discussed herein with respect to FIGS. 22A-22C. The side view 2304 of FIG. 23C illustrates the arrangement of the components of the capacitor module (as discussed and defined in FIG. 14) through a cross-sectional view of a side of the capacitor module. It should be noted that although FIG. 14 sets forth a surface mounted capacitor module, some of the elements of FIG. 14 are also included in the non-surface mounted capacitor module as set forth in FIGS. 23A-23C.

FIGS. 24A-24C illustrate an embodiments of the non-surface mounted capacitor module discussed herein. The top view 2400 of FIG. 24A sets forth the orientation of the anodized pellets 1304 within the capacitor module. The capacitor module can include one or more wires 1302 connecting the anodized pellets 1304 to the external anode connection 1318 respectively. The capacitor module can further include conductive traces 1306 each arranged on the substrate 1308 to provide a conductive pathway between all of the anodized pellets 1304. The bottom view 2402 of FIG. 24B illustrates the external anode connections 1318 and an external cathode connection 1320 arranged exclusively at the side surfaces 1420 of the non-surface mounted capacitor module. The external anode connections 1318 are each configured to provide an electrical connection from the side surfaces 1420 of the capacitor module to one or more wires 1302 and ultimately to one or more anodized pellets 1304. The external cathode connections 1320 are configured to provide a connection to each of the conductive traces 1306 and ultimately to a cathode portion of one or more of the anodized pellets 1304, conductive paste 1412, or conductive pad on which the anodized pellets 1304 can be set. The external anode connections 1318, as illustrated in FIG. 24C can be on a side surface 1420 that is perpendicular to, parallel to, or otherwise different than a side surface 1420 on which the external cathode connections 1320 reside. Additionally, the side view 2404 of FIG. 24C illustrates the arrangement of the components of the capacitor module (as discussed in FIGS. 14, 22, and 23) through a cross-sectional view of a side of the non-surface mounted capacitor module. It should be noted that FIGS. 24A-24C can be further understood in view of the discussions of FIGS. 14, 23, and 24.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications, combinations, and variations are possible in view of the above teachings and within the scope of this disclosure.

What is claimed is:

1. A capacitor module, comprising:
a substrate having a bottom surface, a first side surface and a second side surface;
a first row of pellets carried by the substrate;
a second row of pellets carried by the substrate, pellets of the first and the second rows being aligned in columns,
wherein at least one of the columns is characterized as having (i) a metallized surface formed on the first side surface and electrically connected to at least one pellet of the first row through a wire, the metallized surface covering the wire and at least partially the first side surface of the substrate, (ii) a first conductive plate covering the metallized surface and extending to the bottom surface, (iii) a second conductive plate electrically connected to at least one pellet of the second row, the second conductive plate extending from the second side surface to the bottom surface, and (iv) a third conductive plate electrically connected to both a cathode of the at least one pellet of the first row and a cathode of the at least one pellet of the second row, the third conductive plate being positioned on the bottom surface between the first and second conductive plates.

2. The capacitor module of claim 1, wherein the substrate has a thickness within a range of 25 micrometers to 500 micrometers.

3. The capacitor module of claim 1, wherein the metallized surface comprises a metal, metal alloy, and/or a metal particle loaded resin material.

4. The capacitor module of claim 1, wherein the substrate comprises a via embedded inside the substrate, the via is configured to electrically connect the cathode of the at least one pellet of the first row to the third conductive plate.

5. The capacitor module of claim 1, wherein the first conductive plate is configured to provide an external anode connection.

6. The capacitor module of claim 1, wherein the first conductive plate extends across the entire first side surface of the capacitor module.

7. The capacitor module of claim 1, wherein the third conductive plate is further electrically connected to a second pellet of the first row and a second pellet of the second row.

8. The capacitor module of claim 1, wherein the metallized surface is formed from sputtering.

9. A capacitor having a bottom surface configured to be coupled to a circuit board and having a side surface, comprising:
  an array of pellets, each pellet having an anode electrically coupled to the side surface; and
  a conductive trace arranged on a substrate of the capacitor, the conductive trace being commonly connected to cathodes of the array of pellets and being connected to the side surface such that the capacitor having multiple external anode connections and at least one common external cathode connection on the same side surface.

10. The capacitor of claim 9, wherein the array of pellets comprises a valve metal material.

11. The capacitor of claim 9, wherein the external anode connections and external cathode connection are connected to conductive plates.

12. The capacitor of claim 9, further a second array of pellets, each pellet of the second array having an anode electrically coupled to a second side surface opposite the side surface.

13. A capacitor having a bottom surface configured to be coupled to a circuit board and having a first side surface opposite a second side surface, comprising:
  a substrate carrying multiple pellets arranged in rows;
  a first row of pellets having anodes connected to at least a first conductive plate on the first side surface, the first conductive plate extending at least partially to the bottom surface, thereby forming at least a first external anode connection on the bottom surface;
  a second row of pellets having anodes connected to at least a second conductive plate on the second side surface, the second conductive plate extending at least partially to the bottom surface, thereby forming at least a second external anode connection on the bottom surface;
  a common external cathode connection formed on the bottom surface and positioned between the first and second external anode connections, the common external cathode connection being electrically connected to at least a first cathode of a first pellet from the first row of pellets and to a second cathode of a second pellet from the second row of pellets.

14. The capacitor of claim 13, wherein the substrate has a thickness within a range of 25 micrometers to 500 micrometers.

15. The capacitor of claim 13, wherein the common external cathode connection is connected to the first cathode through a conductive via embedded inside the substrate.

16. The capacitor of claim 13, wherein cathodes of all pellets of the first row of pellets and cathodes of all pellets of the second row of pellets are commonly electrically connected to the common external cathode connection.

17. The capacitor of claim 13, wherein the multiple pellets are additionally arranged in columns such that each column comprises a member pellet from each row.

18. The capacitor of claim 17, wherein each of the column comprises multiple external anode connections and a single common external cathode connection.

19. The capacitor of claim 13, wherein the first row of pellets corresponds to a first row of external anode connections on the bottom surface, the first row of external anode connections includes the first external anode connection, and
  the second row of pellets corresponds to a second row of external anode connections on the bottom surface, the second row of external anode connections includes the second external anode connection.

20. The capacitor of claim 13, wherein pellets of the first row of pellets are all commonly electrically connected to the first external anode connection and pellets of the second row of pellets are all commonly electrically connected to the second external anode connection.

* * * * *